(12) United States Patent
Bibl et al.

(10) Patent No.: US 10,923,023 B1
(45) Date of Patent: Feb. 16, 2021

(54) STACKED HYBRID MICRO LED PIXEL ARCHITECTURE

(71) Applicant: Apple Inc., Cupertino, CA (US)

(72) Inventors: Andreas Bibl, Los Altos, CA (US); Xia Li, San Jose, CA (US); John A. Higginson, Santa Clara, CA (US); Vaibhav D. Patel, San Jose, CA (US); Kapil V. Sakariya, Los Altos, CA (US); Imran Hashim, Saratoga, CA (US); Tore Nauta, Santa Cruz, CA (US); Thomas Charisoulis, Mountain View, CA (US)

( * ) Notice: Subject to any disclaimer, the term of this patent is extended or adjusted under 35 U.S.C. 154(b) by 336 days.

(21) Appl. No.: 15/380,860

(22) Filed: Dec. 15, 2016

Related U.S. Application Data

(60) Provisional application No. 62/287,208, filed on Jan. 26, 2016.

(51) Int. Cl.
  *G09G 3/32* (2016.01)
  *H01L 27/32* (2006.01)

(52) U.S. Cl.
  CPC .......... *G09G 3/32* (2013.01); *H01L 27/3255* (2013.01); *H01L 27/3262* (2013.01); *G09G 2300/0809* (2013.01); *G09G 2320/0626* (2013.01)

(58) Field of Classification Search
  CPC ............. G09G 3/32; G09G 2300/0809; G09G 2320/0626; H01L 27/3255; H01L 27/3266
  See application file for complete search history.

(56) References Cited

U.S. PATENT DOCUMENTS

| | | | |
|---|---|---|---|
| 8,349,116 B1 | 1/2013 | Bibl et al. | |
| 9,047,818 B1* | 6/2015 | Day | G09G 3/3233 |
| 9,153,545 B2* | 10/2015 | Yamamoto | H01L 23/3107 |
| 9,520,537 B2* | 12/2016 | Bower | G09G 3/32 |
| 10,515,581 B2* | 12/2019 | Lin | H01L 25/0753 |
| 2006/0169993 A1* | 8/2006 | Fan | H01L 27/153 257/88 |
| 2010/0319847 A1* | 12/2010 | Cok | H01L 24/95 156/272.8 |
| 2012/0194564 A1* | 8/2012 | White | G09G 3/2088 345/690 |
| 2013/0088416 A1* | 4/2013 | Smith | G09G 3/3233 345/76 |
| 2013/0126081 A1* | 5/2013 | Hu | H01L 24/75 156/249 |
| 2013/0126589 A1 | 5/2013 | Bibl et al. | |
| 2014/0084240 A1 | 3/2014 | Hu et al. | |
| 2014/0168037 A1 | 6/2014 | Sakariya et al. | |
| 2014/0300281 A1* | 10/2014 | Chaji | G09G 3/3233 315/161 |
| 2015/0187991 A1 | 7/2015 | McGroddy et al. | |

(Continued)

FOREIGN PATENT DOCUMENTS

WO WO-2018175338 A1 * 9/2018 ............... G09G 3/14

*Primary Examiner* — Alexander Eisen
*Assistant Examiner* — Nathaniel P Brittingham
(74) *Attorney, Agent, or Firm* — Jaffery Watson Mendonsa & Hamilton LLP

(57) ABSTRACT

Hybrid chiplets, display backplanes, and displays with integrated hybrid chiplets are described. In an embodiment, a hybrid chiplet includes a micro LED chiplet stacked on a micro driver chiplet that includes at least one drive transistor and a bottom side including a plurality of bottom chiplet contacts for electrical connection with a display backplane.

23 Claims, 30 Drawing Sheets

(56) References Cited

U.S. PATENT DOCUMENTS

| | | | |
|---|---|---|---|
| 2015/0348504 A1* | 12/2015 | Sakariya | G09G 3/3233 |
| | | | 345/206 |
| 2015/0349200 A1* | 12/2015 | Chen | H01L 33/145 |
| | | | 257/98 |
| 2016/0307519 A1* | 10/2016 | Chen | G02B 6/005 |
| 2017/0132976 A1* | 5/2017 | Yang | G09G 3/2003 |
| 2018/0042110 A1* | 2/2018 | Cok | H01L 24/02 |
| 2018/0211582 A1 | 7/2018 | Sakariya et al. | |
| 2018/0247586 A1 | 8/2018 | Vahid Far et al. | |

* cited by examiner

STACKED HYBRID MICRO LED PIXEL ARCHITECTURE

RELATED APPLICATIONS

This application claims the benefit of priority of U.S. Provisional Application No. 62/287,208 filed Jan. 26, 2016, which is incorporated herein by reference.

BACKGROUND

Field

Embodiments described herein relate to display systems. More particularly, embodiments relate to display driving circuitry for micro LED displays.

Background Information

State of the art displays for phones, tablets, computers and televisions utilize glass substrates with thin-film transistors (TFT) to control transmission of backlight through pixels based on liquid crystals. More recently emissive displays such as those based on Organic Light Emitting Diodes (OLED) have been introduced because they can be more power efficient, allowing each pixel to be turned off completely when displaying black or dark colors. In yet an alternative technology, it has been proposed to transfer a large array (~100,000) of micro light emitting diodes (μLEDs) from a donor substrate to a display backplane, utilizing μLEDs instead of OLEDs for an emissive display. μLEDs based on III-V compound semiconductors are potentially more energy efficient and also are not prone to lifetime degradation and extreme sensitivity to moisture as is the case for OLEDs.

SUMMARY

Embodiments describe hybrid chiplets, display backplanes, and display including integrated hybrid chiplets. In an embodiment, a hybrid chiplet includes a micro LED chiplet bonded to, and stacked on top of, a micro driver chiplet. The micro driver chiplet includes a drive transistor, a top side including an anode contact electrically connected to a first source/drain terminal of the drive transistor, a bottom side including a plurality of bottom chiplet contacts. The micro LED chiplet may be bonded to the anode contact of the micro driver chiplet. A bottom LED contact may be bonded to the anode contact of the micro driver chiplet, for example, with a metal-metal bond. A polymer bonding material may additionally adhere the micro LED chiplet to the micro driver chiplet. One or more passivation layers may span sidewalls of the hybrid chiplets. For example, separate passivation layers may span sidewalls of the micro LED chiplet and the micro driver chiplet, or a single passivation layer may span sidewalls of both the micro LED chiplet and the micro driver chiplet.

In accordance with embodiments, the drive transistor is formed in a single crystalline device layer. The plurality of bottom chiplet contact may include a gate contact that is electrically connected to a gate terminal of the drive transistor, and a power contact that is electrically connected to a second source/drain terminal of the drive transistor. In an embodiment, a second drive transistor is connected in parallel with the drive transistor between the power contact and the anode contact. For example, such a configuration may not require any additional contacts on the top or bottom of the micro driver chiplet.

In an embodiment, the micro driver chiplet additionally includes an emission control transistor in series with the drive transistor and electrically connected between the drive transistor and the power contact. In such a configuration, the bottom side of the micro driver chiplet may include an emission control contact that is electrically connected to a gate terminal of the emission control transistor. In addition, the bottom side of the micro driver chiplet may include a source contact that is electrically connected to the first source/drain terminal of the drive transistor and is electrically connected between the drive transistor and the anode contact.

In an embodiment, the micro driver chiplet further includes a select transistor. In such a configuration, the bottom side of the micro driver chiplet may include a scan contact electrically connected with a gate terminal of the select transistor and a data contact electrically connected with a first source/drain terminal of the select transistor.

In an embodiment, a display includes a backplane including a subpixel circuitry including a plurality of contact pads, and a hybrid chiplet bonded to the plurality of contacts pads. A variety of hybrid chiplets with a variety of devices and circuitries can be integrated on the display backplane. The hybrid chiplet includes a micro LED chiplet bonded to, and stacked on, a micro driver chiplet. In an embodiment, a micro driver chiplet includes a drive transistor, a top side including an anode contact electrically connected to a first source/drain terminal of the drive transistor, and bottom side including a corresponding plurality of bottom chiplet contacts bonded to the plurality of contact pads. The micro LED chiplet may be bonded to the anode contact of the micro driver chiplet.

In an embodiment, the plurality of contact pads includes a selection input pad and a power input pad, and the plurality of bottom chiplet contacts includes a gate contact that is electrically connected to a gate terminal of the drive transistor, a power contact that is electrically connected to a second source/drain terminal of the drive transistor, and the gate contact is bonded to the selection input pad and the power contact is bonded to the power input pad. In an embodiment, the micro driver chiplet further includes a second drive transistor connected in parallel with the drive transistor between the power contact and the anode contact.

In one embodiment, the plurality of contact pads additionally includes an emission control input pad, and the micro driver chiplet further includes an emission control transistor in series with the drive transistor and electrically connected between the drive transistor and the power contact, and emission control contact that is electrically connected to a gate terminal of the emission control transistor. In such a configuration, the emission control contact may be bonded to the emission control input pad.

In one embodiment, the plurality of contact pads additionally includes a scan input pad and a data input pad, and the micro driver chiplet further includes a select transistor, a scan contact electrically connected with a gate terminal of the select transistor, and a data contact electrically connected with a first source/drain terminal of the select transistor. In such a configuration, the scan contact is bonded to the scan input pad, and the data contact is bonded to the data input pad.

Display backplanes are also described prior to bonding of the hybrid chiplets. In an embodiment, a display backplane subpixel circuitry includes a thin film select transistor, a scan line coupled to a gate terminal of the thin film select transistor, a data line coupled to a first source/drain terminal of the thin film select transistor, and a node (N1) coupled to a second source/drain terminal of the thin film select transistor, a first terminal of a storage capacitor, and an open selection input pad. In one embodiment, the display backplane subpixel circuitry additionally includes a thin film emission control transistor, a Vdd line coupled to a first source/drain terminal of the thin film emission control transistor, an emission control line coupled to a gate terminal of the thin film emission control transistor, and a node (N2) coupled to a second source/drain terminal of the thin film emission control transistor; a second terminal of the storage capacitor, and an open power input pad. In one embodiment, the display backplane subpixel circuitry additionally includes a Vdd line coupled to an open power input pad, and an emission control line coupled to an open emission control input pad.

In an embodiment, a display backplane subpixel circuitry includes a thin film emission control transistor, a Vdd line coupled to a first source/drain terminal of the thin film emission control transistor, an emission control line coupled to a gate of the thin film emission control transistor, and a node (N2) coupled to a second source/drain terminal of the thin film emission control transistor, a second terminal of a storage capacitor; and an open power input pad. In one embodiment, the display backplane subpixel circuitry additionally includes a scan line coupled to an open scan input pad, a data line coupled to an open data input pad, and an open selection input pad coupled to a first terminal of the storage capacitor.

In an embodiment, a method of forming an array of hybrid chiplets includes forming an array of drive transistors in a single crystalline substrate, bonding the single crystalline substrate including the array of drive transistors to an LED substrate, bonding the single crystalline substrate to a carrier substrate with a stabilization layer, and forming an array of trenches through the LED substrate and the single crystalline substrate to form an array of hybrid chiplets, each hybrid chiplet including a micro LED chiplet bonded to a micro driver chiplet.

In an embodiment, a method of forming bulk drive transistor wafer includes forming an array of drive transistors in a single crystalline substrate, forming an array of conductive plugs through the single crystalline substrate, connecting the array of drive transistors to the array of conductive plugs, forming an array of trenches surrounding the array of drive transistors, filling the trenches with a sacrificial material, and forming an array of anode contacts on the array of drive transistors.

Various methods of forming arrays of hybrid chiplets are described including pre-formed sacrificial trenches, a top-side trench last approach, and a bottom-side sacrificial trench approach. In one embodiment, a method of forming an array of hybrid chiplets includes bonding a p-n diode layer including an array of LED mesas surrounded by sacrificial trenches to a bulk drive transistor wafer including an array of sacrificial trenches, bonding the bulk drive transistor wafer to a carrier substrate, and removing the sacrificial material from the arrays of trenches to form an array of hybrid chiplets, each hybrid chiplet including a micro LED chiplet bonded to a micro driver chiplet.

In one embodiment, one embodiment, a method of forming an array of hybrid chiplets includes bonding a p-n diode layer to a bulk drive transistor wafer, forming an array of trenches through the p-n diode layer and then through the bulk drive transistor wafer, and removing a sacrificial layer from underneath the bulk drive transistor wafer to form an array of hybrid chiplets, each hybrid chiplet including a micro LED chiplet bonded to a micro driver chiplet.

In one embodiment, a method of forming an array of hybrid chiplets includes bonding a p-n diode layer to a bulk drive transistor wafer, forming an array of trenches through the bulk drive transistor wafer and then through the p-n diode layer, filling the array of trenches with a sacrificial material, bonding the bulk drive transistor wafer to a carrier substrate, and removing the sacrificial material from the arrays of trenches to form an array of hybrid chipets, each hybrid chiplet including a micro LED chiplet bonded to a micro driver chiplet.

DETAILED DESCRIPTION

Figure 1A:
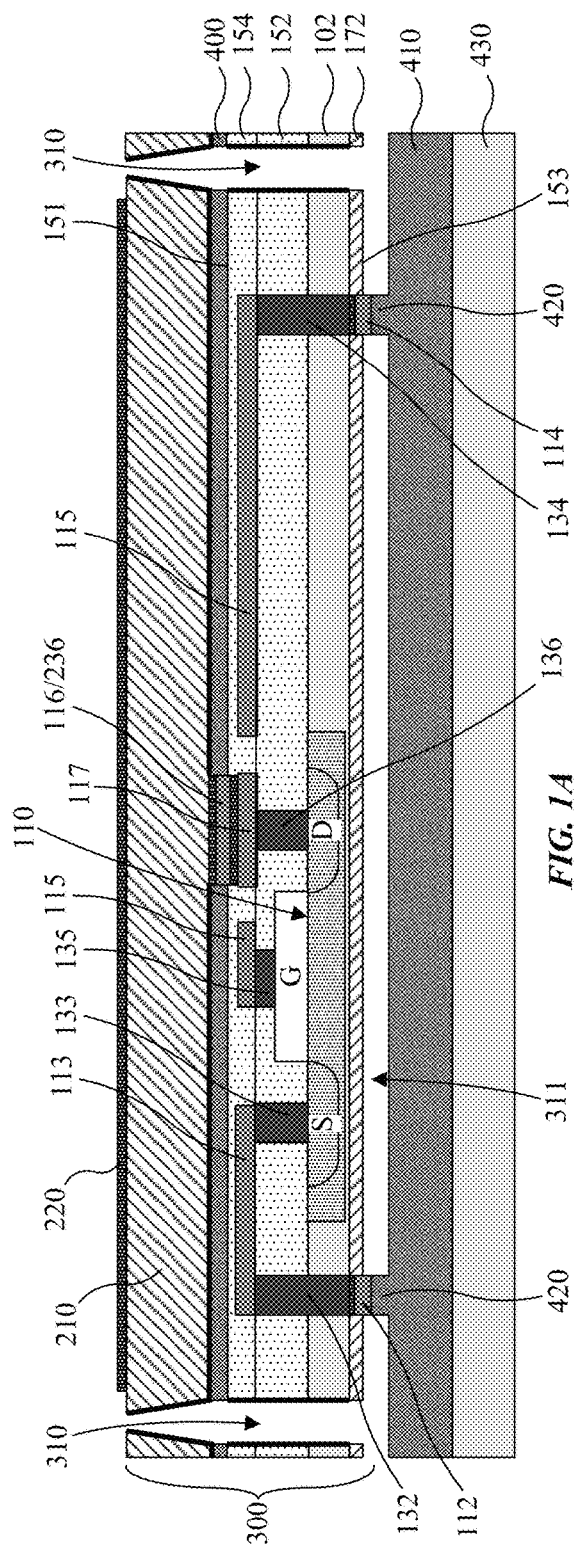
FIG. 1A is a schematic cross-sectional side view illustration of a hybrid chiplet supported on a carrier substrate in accordance with an embodiment.

Embodiments describe hybrid chiplets and display systems. In an embodiment, a hybrid chiplet includes a micro driver chiplet including a drive transistor, and a micro LED chiplet bonded to (and stacked on) the micro driver chiplet. In essence the hybrid chiplets are portions of a display subpixel including a μLED and its own drive transistor that is stacked underneath it, taking up no additional display area. In accordance with embodiments, at least one drive transistor is fabricated using semiconductor integrated circuit (IC) type material (e.g. high quality monocrystalline silicon such as an epitaxial device layer) and process to achieve a higher carrier mobility and lifetime compared to that achievable with TFT processing techniques, and hence also satisfy the current requirement for driving the μLED. In accordance with embodiments, the vertical μLEDs and drive transistors are fabricated on separate temporary carrier wafers and then bonded together using metal-metal compression bonding. A vapor HF process may be used to form separate hybrid chiplets, each including a stacked μLED and drive transistor. The hybrid chiplets may then be picked up with a mass transfer tool and bonded onto a pre-fabricated display backplane in which other parts of the subpixel circuitries have already been fabricated, for example, using thin film processing techniques.

In one aspect, it has been observed that in-pixel drive transistors for μLEDs for display application can take up a large area due to the relatively high drive current requirement for the μLEDs, compared to OLEDs. Arranging the drive transistors on the same level as the μLEDs (e.g. within separate micro driver chips bonded to the display substrate side-by-side with the μLEDs) takes a penalty of low pixel μLED fill factor as within each pixel a large portion of the area is used for the transistors as opposed to for the μLEDs. Moving the drive transistors to the display backplane (e.g. as TFTs) is met with inefficiencies even with the state of the art low-temperature polysilicon (LTPS) or IGZO transistors which have been observed to have difficulty meeting the required drive current for the μLEDs due to the low carrier mobility and/or the low carrier lifetime in the semiconductor material for the backplane. In accordance with embodiments, the hybrid chiplets include metal-oxide-semiconductor (MOS) drive transistors based on monocrystalline silicon, for which both the carrier mobility and the carrier lifetime are high enough to generate the required drive current. In addition, since the drive transistor is stacked beneath its corresponding μLED, the drive transistor takes up no additional area on the display substrate.

In one aspect, embodiments describe a display architecture that allow for high pixel density (high PPI). The non light emitting drive components may be stacked underneath the μLEDs, resulting in a smaller footprint and area saving compared to a configuration where both μLEDs and driver chiplets are placed separately on the backplane.

In one aspect, embodiments describe a display architecture with a low manufacturing cost. Except for the key drive transistor(s) whose drive current (Ids) needs to be high for μLEDs, all the other parts of the transistors and the circuitries may be fabricated using industry standard display backplanes—such as LTPS or IGZO based processing technologies which are cheaper to fabricate compared to monocrystalline silicon MOS transistors.

In one aspect, embodiments describe a less demanding pick-and-place process as the pick-and-place process for the stacked μLED and drive transistor is essentially the same as the process for μLED itself only. In one embodiment, when placing the hybrid chiplet onto the backplane, there are only two I/Os that need to make contact to the backplane—just one more contact than the μLED only case. In other embodiments, additional circuitry may be contained within the hybrid chiplet, with correspondingly more contacts to be bonded to the backplane.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "top", "bottom", "over", "to", "between", and "on" as used herein may refer to a relative position of one layer with respect to other layers. One layer "over", or "on" another layer or bonded "to" or in "contact" with another layer may be directly in contact with the other layer or may have one or more intervening layers. One layer "between" layers may be directly in contact with the layers or may have one or more intervening layers.

Figure 1B:
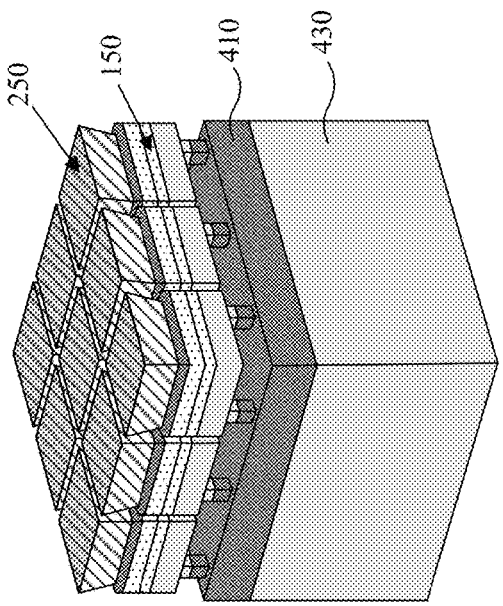
FIG. 1B is a perspective view illustration of a single hybrid chiplet supported on a carrier substrate in accordance with an embodiment.
Figure 1C:
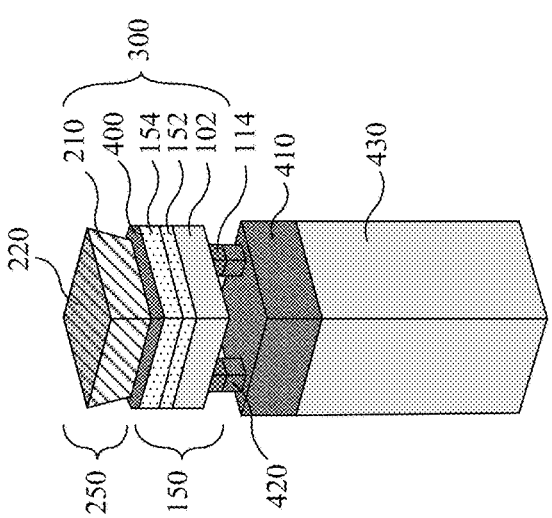
FIG. 1C is a perspective view illustration of an array of hybrid chiplets supported on a carrier substrate in accordance with an embodiment.

Referring now to FIG. 1A-1C schematic cross-sectional side view and perspective view illustrations are provided of hybrid chiplets 300 supported on a carrier substrate in accordance with embodiments. In the embodiments illustrated, a hybrid chiplet 300 includes a micro driver chiplet 150 and a micro LED chiplet 250 bonded to the micro driver chiplet 150. In an embodiment, a hybrid chiplet 300 may have a maximum lateral dimension of 1 to 300 µm, 10 to 100 µm, 10 to 20 µm, or more specifically 1 to 10 µm, such as 5 µm. For example, these reduced dimensions may be necessary for integration into high density displays, with a high pixel per inch (PPI) count. The micro LED chiplet 250 may include a vertical micro LED 210, a top LED contact 220, and a bottom LED contact 236. In accordance with embodiments, the vertical micro LED 210 is formed of inorganic semiconductor materials.

The micro driver chiplet 150 includes at least a drive transistor 110, a top side 151 including an anode contact 116 electrically connected to a first source/drain terminal (e.g. drain (D) terminal) of the drive transistor 110, and a bottom side 153 including a plurality of chiplet contacts (e.g. 112, 114, etc.). The chiplet contact can assume a variety of configurations including pads and studs. For example, stud shaped chiplet contacts may protrude from the bottom side 153 of the micro driver chiplet 150/hybrid chiplet 300. In an embodiment, the micro LED chiplet 250 is bonded to the anode contact 116 of the micro driver chiplet 150. More specifically the bottom LED contact 236 of the micro LED chiplet 250 may be bonded to the anode contact 116 of the micro driver chiplet 150 with a metal-metal bond. A polymer bonding material 400 may additionally be located between the chiplets to adhere the micro LED chiplet 250 to the micro driver chiplet 150.

In accordance with embodiments, the drive transistor 110 may be formed in a single crystalline device layer 102, such as an epitaxial silicon layer. In addition, the drive transistor 110 may be a MOSFET. The bottom side 153 of the micro driver chiplet 150 includes a gate contact 114 that is electrically connected to a gate terminal of the drive transistor 110, and a power contact 112 that is electrically connected to a source/drain terminal (e.g. source (S) terminal) of the drive transistor 110. In the embodiment illustrated, the power contact 112 is electrically connected to a source (S) terminal of the drive transistor through plug 132, interconnect layer 113, and plug 133. In the embodiment illustrated, the gate contact 114 is electrically connected to the gate (G) terminal of the drive transistor through plug 134, interconnect layer 115, and plug 135. In the embodiment illustrated, the anode contact 116 is electrically connected to the drain (D) terminal of the drive transistor 110 through interconnect layer 117 and plug 136.

In accordance with embodiments, plugs 133, 135, 136 contacting the terminals of the drive transistor 110 may be formed through a first interlayer dielectric (ILD-1) 152, while plugs 132, 134 are formed through ILD-1 152 and device layer 102 in order to provide electrical connection to the chiplet contacts 112, 114 on the back side 153 of the micro driver chiplet 150. A first metal layer (M1) may be formed over the ILD-1 152 to provide electrical connection to the plugs. Specifically, M1 may be patterned to form interconnect layer 113 electrically connnecting plug 132 to plug 133, interconnect layer 115 electrically connecting plug 135 to plug 134, and interconnect layer 117 electrically connecting plug 136 to anode contact 116. A second interlayer dielectric (ILD-2) 154 may be formed over the M1 interconnect layers 113, 115, 117 to provide electrical insulation. An opening may be formed in the ILD-2 154 for the formation of the anode contact 116 on interconnect layer 117. The bottom side 153 of the micro driver chiplet 150 may be chemically protected with a barrier layer 172 (e.g. $SiN_x$).

Figure 1D:
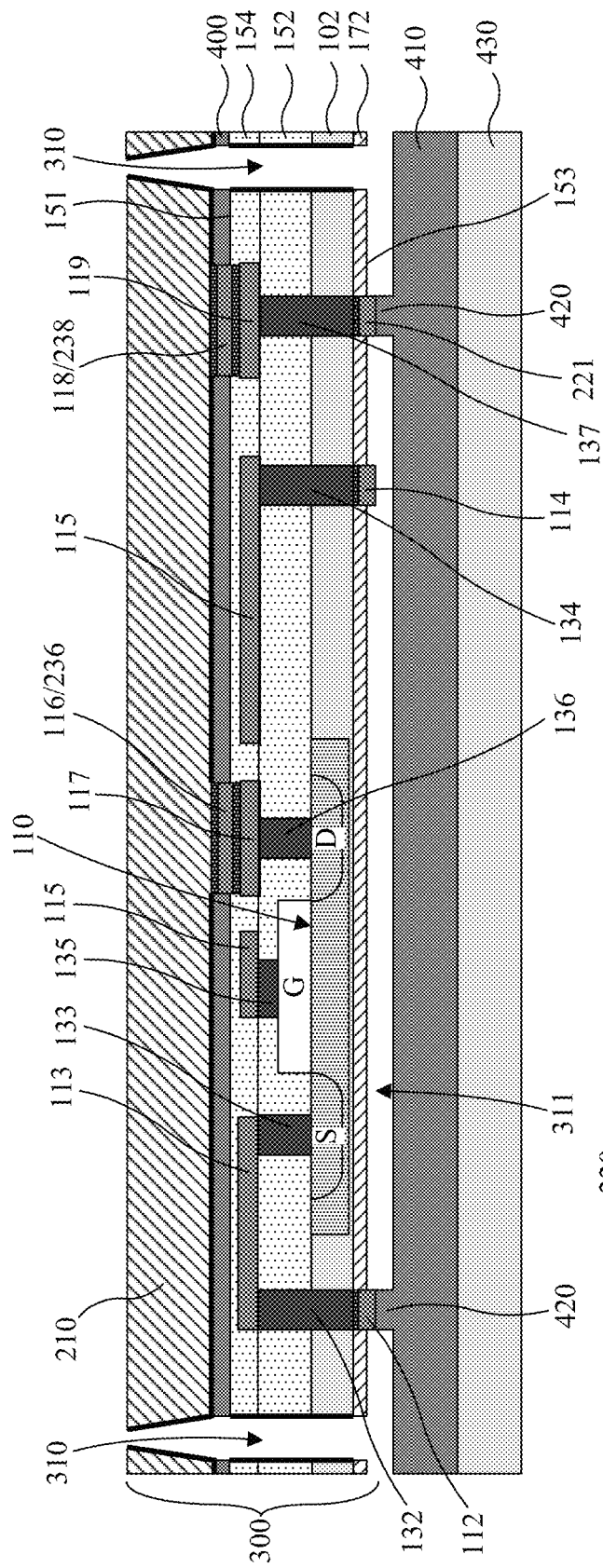
FIG. 1D is a schematic cross-sectional side view illustration of a hybrid chiplet supported on a carrier substrate in accordance with an embodiment.

FIG. 1D is a schematic cross-sectional side view illustration of a hybrid chiplet 300 similar to the one illustrated in FIG. 1D, with the addition of a bottom cathode contact 221 rather than a top LED contact 220 in accordance with an embodiment. In such a configuration, all I/O contacts may be arranged on the bottom side 153 of the hybrid chiplet 300. In the embodiment illustrated, the bottom LED contacts 236, 238 of the micro LED chiplet 250 may be bonded to the anode contact 116 and cathode contact 118, respectively, of the micro driver chiplet 150 with a metal-metal bonds. Cathode contact 118 may be electrically connected to bottom cathode contact 221 through interconnect layer 119 and plug 137.

Figure 1E:
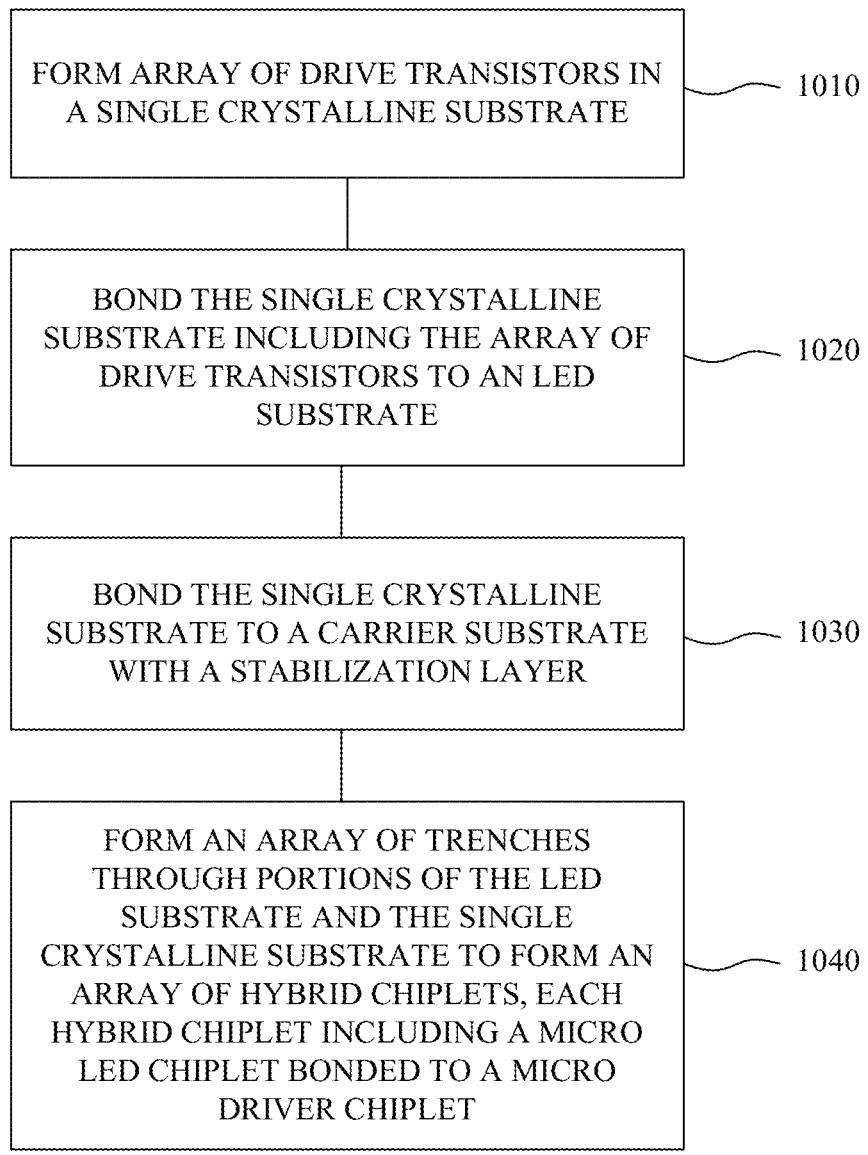
FIG. 1E is a flow chart illustrating method of forming an array of hybrid chiplets in accordance with an embodiment.

Referring now FIG. 1E in combination with FIGS. 1A-1D, an array of hybrid chiplets 300 may be fabricated on a carrier substrate 430 so that they are poised for pick up and transfer to a receiving substrate (e.g. display substrate) using a suitable transfer tool such as an electrostatic transfer head assembly including an array of electrostatic transfer heads. At operation 1010 an array of drive transistors 110 is formed in a single crystalline substrate. For example, the drive transistors may be formed in a single crystalline silicon substrate, or an epitaxially grown device layer 102 in a silicon-on-insulator (SOI) substrate. At operation 1020 the single crystalline substrate including the array of drive transistors 110 is bonded to an LED substrate. For example, the LED substrate may include a p-n diode layer on a support substrate, such as a silicon wafer, growth substrate, etc. At operation 1030 an opposite side of the single crystalline substrate including the array of drive transistors 110 is bonded to a carrier substrate 430 with a stabilization layer 410. At operation 1040 an array of trenches 310 is formed through portions of the LED substrate and the single crystalline substrate to form an array of hybrid chiplets 300, with each hybrid chiplet 300 including a micro LED chiplet 250 bonded to a micro driver chiplet 150. In accordance with embodiments, the trenches 310 may be formed at a variety of approaches, such as a hybrid chiplets with pre-formed sacrificial trenches (see FIGS. 9-10I), a top-side trench last approach (see FIGS. 11-12D), or a bottom-side sacrificial trench approach (see FIGS. 13-14G). Thus, the formation of trenches 310 may be optionally be accompanied by the removal of a sacrificial material from within the trenches.

Additionally, a sacrificial layer material may additionally be removed from underneath the hybrid chiplets 300 to form cavities 311 beneath the hybrid chiplets 300. In the embodiments illustrated in FIGS. 1A-1D, after removal of the sacrificial materials the hybrid chiplets 300 may be supported by support posts 420 of the stabilization layer 410. Specifically, the plurality of chiplet contacts (e.g. 112, 114, 221 etc.) may be supported by the support posts 420.

In the particular embodiment illustrated in FIGS. 1A-1C, two bottom chiplet contacts (power contact 112, gate contact 114) are illustrated, with each being supported by a support post 420. However, embodiments are not limited to two bottom chiplet contacts, and the hybrid chiplets 300 may include a larger number of bottom chiplet contacts depending upon the number of devices (e.g. additional drive transistor, select transistor, emission control transistor, etc.) and circuitry contained with the micro driver chiplets 150. For example, in the embodiment illustrated in FIG. 1D, three bottom chiplet contacts (power contact 112, gate contact 114, cathode contact 221) are illustrated. In circumstances where greater than one bottom chiplet contact is present, the number of support posts 420 may be the same or less than the number of bottom chiplet contacts. Thus, not every bottom chiplet contact is required to be supported by a support post 420. For illustrational purposes only, the gate contact 114 in FIG. 1D is illustrated as not being supported by a support post 420, though a variety of alternative configurations are possible. The number, size, and arrangement of support posts 420 may be determined spatially to balance and retain the hybrid chiplets 300 on the carrier substrate 430. The total contact area of the support posts 420 and bottom chiplet contacts may additionally determine the amount of adhesion (pressure) that must be overcome to pick up the hybrid chiplets 300.

Figure 2:
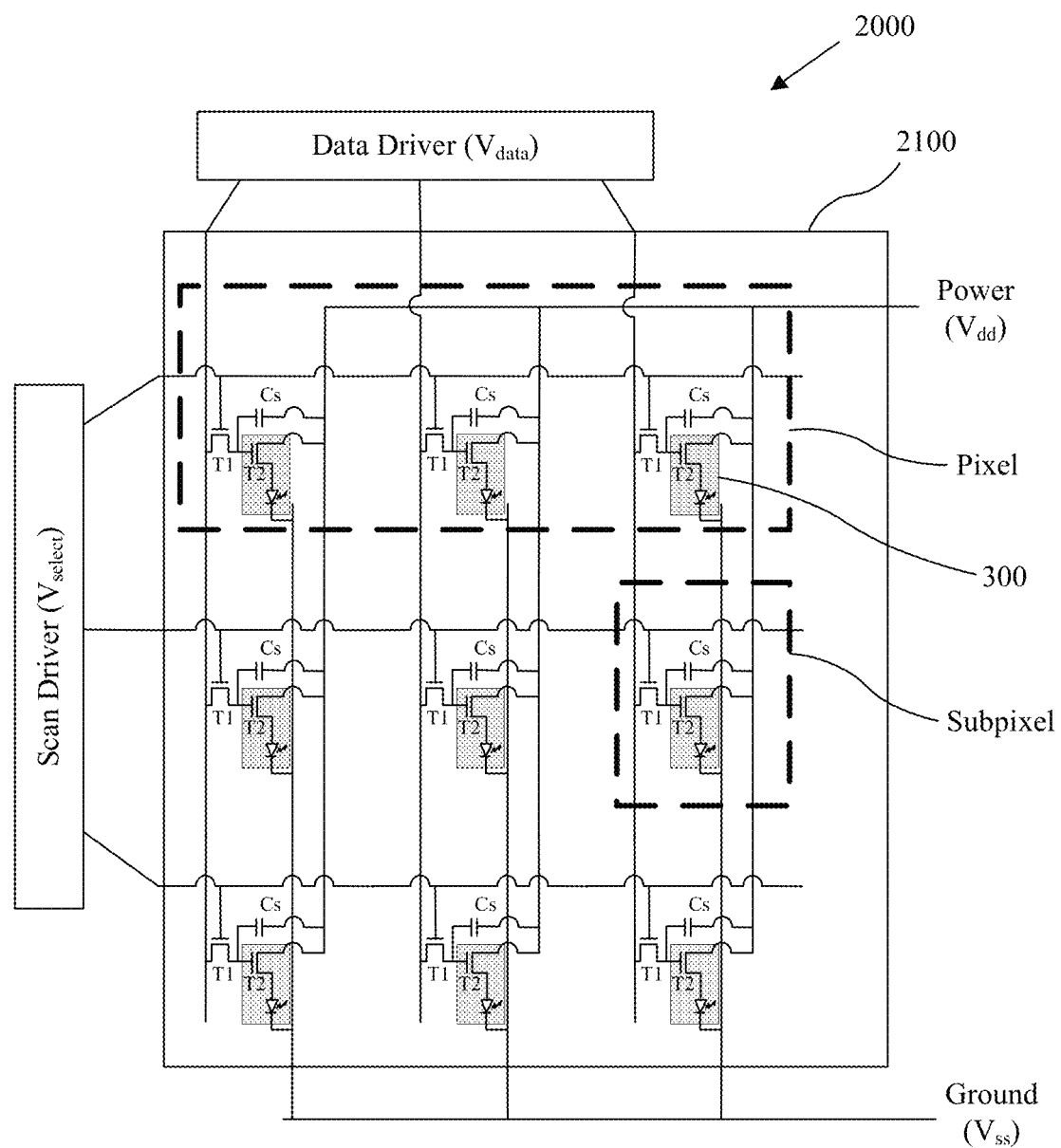
FIG. 2 is a circuit diagram illustrating circuitry within a display backplane and within an array of hybrid chiplets bonded to the display backplane in accordance with an embodiment.

An array of hybrid chiplets 300 may then be transferred from the carrier substrate 430 to a receiving substrate (e.g. display substrate) using a suitable transfer tool such as an electrostatic transfer head assembly including an array of electrostatic transfer heads. FIG. 2 is an exemplary circuit diagram of a display 2000 illustrating circuitry within a display backplane 2100 and within an array of hybrid chiplets 300 bonded to the display backplane in accordance with an embodiment. A conventional 2T1C subpixel circuit is illustrated in FIG. 2 by way of example, and embodiments are not so limited. As shown, the display 2000 may include one or more data driver chips and one or more data (Vdata) lines, one or more scan driver chips and one or more scan (Vselect) lines to each subpixel. A power (Vdd) line may also run to each subpixel. Ground lines (Vss) may also be included. Each LED may be connected to a ground (Vss) line with a top contact layer such as indium-tin-oxide (ITO). Each subpixel may include a select transistor T1, a drive transistor T2 (e.g. 110), a storage capacitor Cs, and a vertical micro LED (e.g. 210). In accordance with embodiments, separate arrays of hybrid chiplets 300 may be transferred and bonded to the display backplane 2100 for each subpixel. For example, red-emitting hybrid chiplets, green-emitting hybrid chiplets, and blue-emitting hybrid chiplets may be separately transferred to the display backplane 2100 from three different carrier substrates to form an exemplary RGB pixel, though any number of different pixel color arrangements are possible. In other embodiments, the same hybrid chiplets 300 can be transferred to the different color emitting subpixels, and the emission wavelength can be altered with a wavelength conversion layer (e.g. including quantum dots) formed over certain hybrid chiplets 300. In other embodiments a hybrid chiplet 300 is used for only one or some of the subpixels (e.g. colors). In an embodiment, hybrid chiplets 300 are included for only the red-emitting subpixels, while the display circuitry (e.g. including the drive transistors) for the other subpixels (e.g. blue and green) is retained within the display backplane.

In the following description, various descriptions and illustrations are made with regard to micro driver chiplets, micro LED chiplets, hybrid chiplets, backplanes, and methods of integrating hybrid chiplets onto backplanes. In particular, the following description and illustrations are made with regard to hybrid chiplets that may include a top LED contact (such as described with regard to FIG. 1A). However, it is to be appreciated that the following description and illustrations may be used with hybrid chiplets in which all I/O contacts may be arranged on the bottom side of the hybrid chiplet (such as described with regard to FIG. 1D). In interest of clarity, separate descriptions and illustrations are not provided.

Figure 3A:
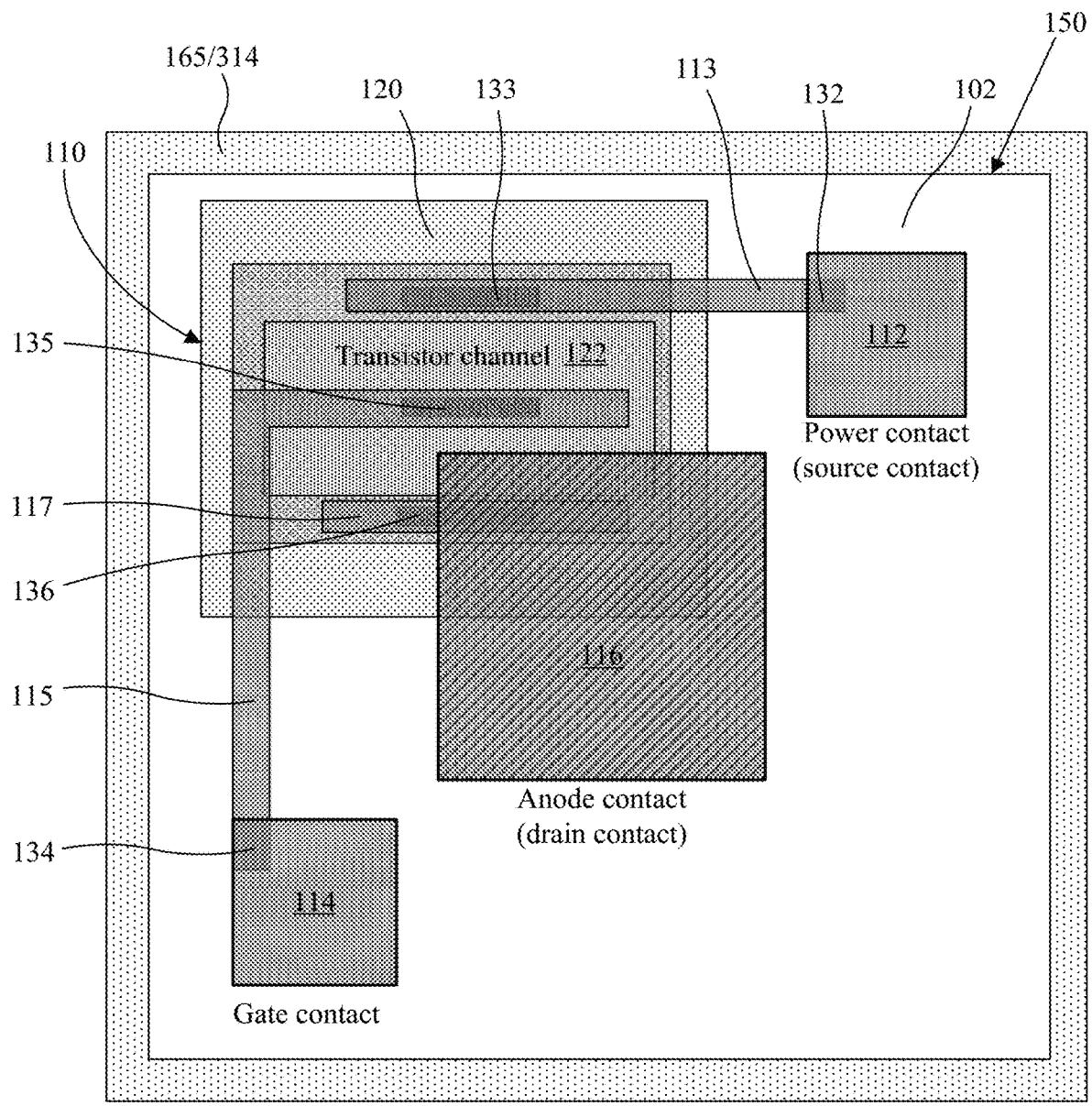
FIG. 3A is a schematic top view illustration of a micro driver chiplet layout in accordance with an embodiment.
Figure 3B:
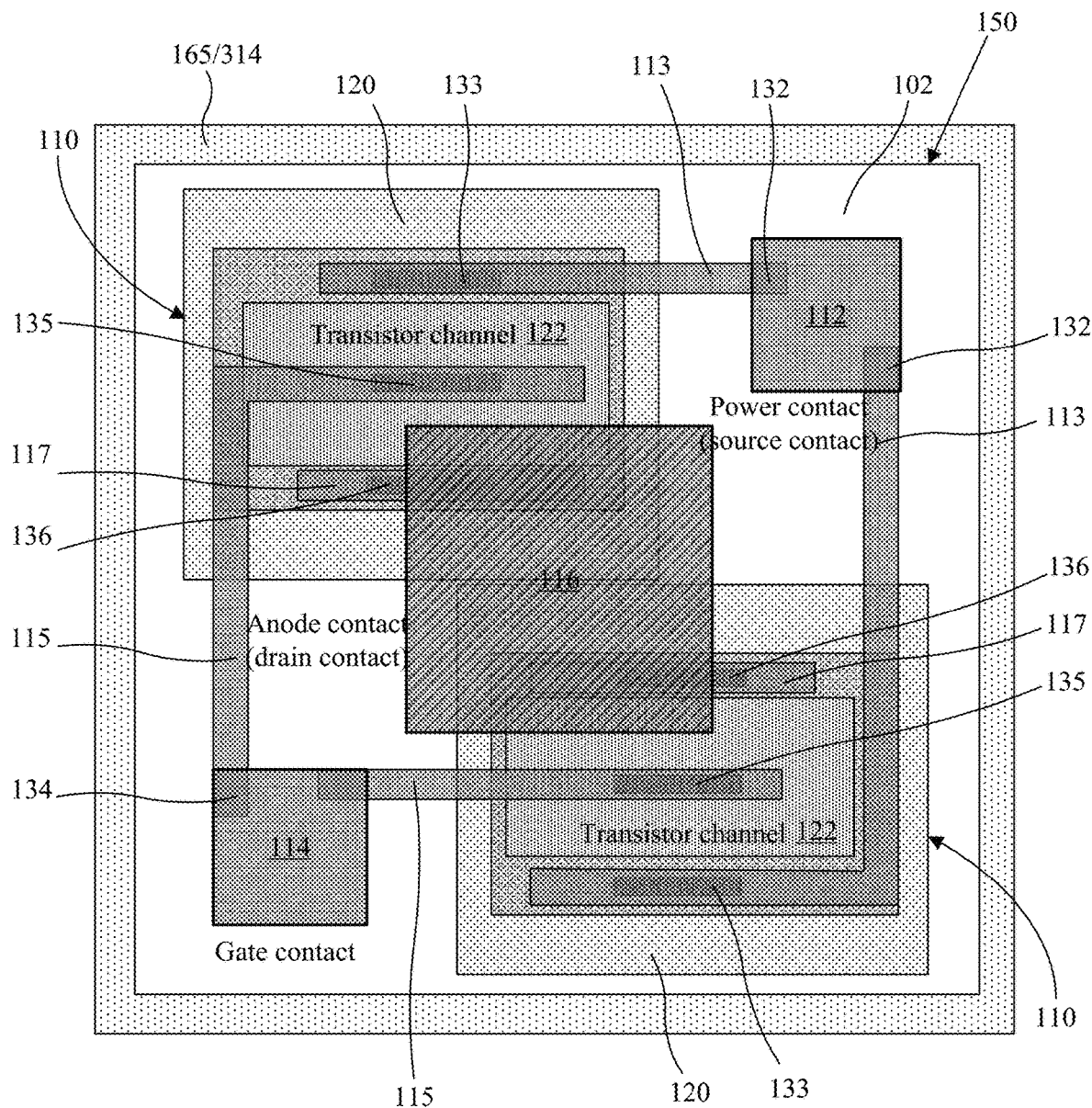
FIG. 3B is a schematic top view illustration of a micro driver chiplet layout including two parallel drive transistors in accordance with an embodiment.

FIG. 3A is a schematic top view illustration of a micro driver chiplet 150 layout in accordance with an embodiment. For example, the micro driver chiplet 150 illustrated in FIG. 3A may be similar to the one illustrated in FIG. 1A including a single drive transistor 110, a bottom power contact 112, bottom gate contact 114, and a top anode contact 116 for bonding to a micro LED chiplet 250. FIG. 3B is a schematic top view illustration of a hybrid chiplet layout including two parallel drive transistors 110 in accordance with an embodiment. In such an embodiment, the bottom power contact 112 may be electrically connected to the source terminal of each drive transistor 110, and the bottom gate contact 114 may be connect to the gate terminal of each drive transistor 110. Similarly, the top anode contact 116 may be electrically connected to the drain terminal of each drive transistor 110. Such a configuration may be implemented, for example, in order to obtain a higher driving current to the vertical micro LED 210 of the hybrid chiplet 300, without any additional contacts.

Figure 4A:
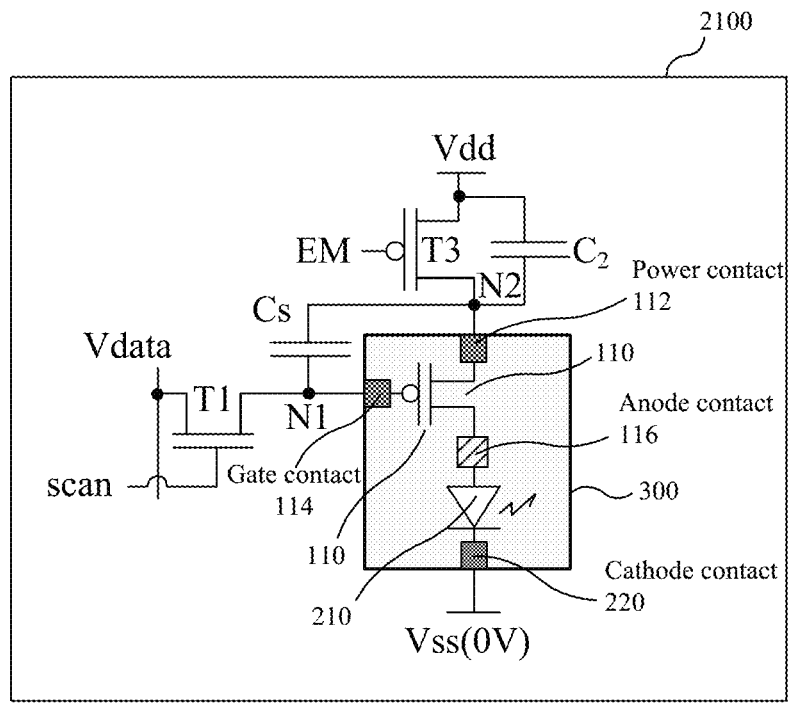
FIG. 4A is a subpixel circuit diagram illustrating a hybrid chiplet including drive transistor bonded to a display backplane in accordance with an embodiment.
Figure 4B:
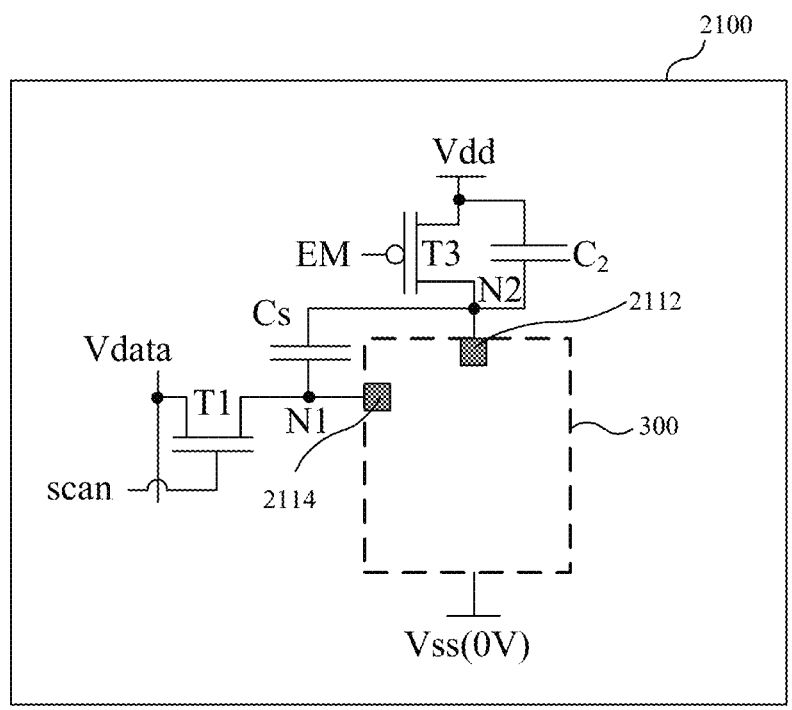
FIG. 4B is a subpixel circuit diagram illustrating the display backplane of FIG. 4A prior to bonding the hybrid chiplet in accordance with an embodiment.

Referring now to FIG. 4A a subpixel circuit diagram is provided illustrating a hybrid chiplet 300 including drive transistor 110 bonded to a display backplane 2100 in accordance with an embodiment. FIG. 4B is a subpixel circuit diagram illustrating the display backplane of FIG. 4A prior to bonding the hybrid chiplet in accordance with an embodiment. The subpixel circuit diagrams illustrated in FIGS. 4A-4B are similar to that illustrated in FIG. 2 with the addition of an emission control transistor (T3), capacitor C2, and emission control (EM) line. In an embodiment, a data driver supplies a pixel data value before the LED is signaled for emission by an emission driver. The pixel value is stored in a storage capacitor (Cs) by the scan driver. The emission driver then sends an emission control (EM) signal to cause illumination of the vertical micro LED 210. In an embodiment, the data driver controls the grey level of the pixels, while the emission driver controls brightness.

As shown, the display backplane 2100 includes a subpixel circuitry including a plurality of contact pads (e.g. 2112, 2114). A hybrid chiplet 300 is bonded to the plurality of contacts pads (e.g. 2112, 2114). In the embodiment illustrated, the hybrid chiplet 300 is bonded to the display backplane 2100 with gate contact 114 bonded to a selection input pad 2114 on the display backplane 2100, and the power contact 112 bonded to the power input pad 2112 on the display backplane 2100. Within the hybrid chiplet 300, the gate contact 114 is electrically connected to a gate terminal of the drive transistor 110, and the power contact 112 is electrically connected to a source/drain terminal (e.g. source (S) terminal) of the drive transistor 110.

The display backplane 2100 circuitry may be fabricated using a suitable thin film processing technique. For example, the display backplane 2100 may include circuitry formed of low temperature poly silicon (LTPS), amorphous silicon, or an oxide materials such as indium gallium zinc oxide (IGZO) which have less expensive fabrication costs than the single crystalline materials used for fabrication of the micro driver chiplets 150. As shown in FIGS. 4A-4B, the display backplane 2100 may include a thin film select transistor (T1), a scan line coupled to a gate terminal of the thin film select transistor, and a data (Vdata) line coupled to a first source/drain terminal of the thin film select transistor (T1). A node (N1) couples a second source/drain terminal of the thin film select transistor (T1), a first terminal of the storage capacitor (Cs), and the selection input pad 2114, which is open in FIG. 4B, and bonded to the gate contact 114 in FIG. 4A.

Still referring to FIGS. 4A-4B, the display backplane 2100 additionally includes a thin film emission control transistor (T3). An emission control (EM) line is coupled to a gate terminal of the emission control transistor (T3). A power (Vdd) line is coupled to a first source/drain terminal (e.g. source (S) terminal) of the emission control transistor (T3). A node (N2) is coupled to a second source/drain terminal (e.g. drain (D) terminal) of the thin film emission control transistor (T3), a second terminal of the storage capacitor (Cs), and a power input pad 2112, which is open in FIG. 4B, and bonded to the power contact 112 in FIG. 4A.

The circuitry illustration in FIG. 4A shows the top LED contact 220 as a cathode contact that is electrically connected to Vss. For example, referring briefly to FIG. 15, this may be facilitated by the formation of a top conductive contact layer 506 on a top LED contact 220. In an embodiment, such as that illustrated in FIG. 1D a bottom cathode contact 221 may be formed on the bottom side 153 of the hybrid chiplet 300. In such an embodiment, the bottom cathode contact 221 illustrated in FIG. 6E may be bonded to a cathode contact pad (not illustrated) on the backplane 2100 that is in electrical connection with the Vss line. In the following description of FIGS. 4A-6F it is understood that the top LED contacts 200 (cathode contacts) may be substituted by bottom cathode contacts 221, along with corresponding cathode contact pads on the backplane 2100.

Figure 4C:
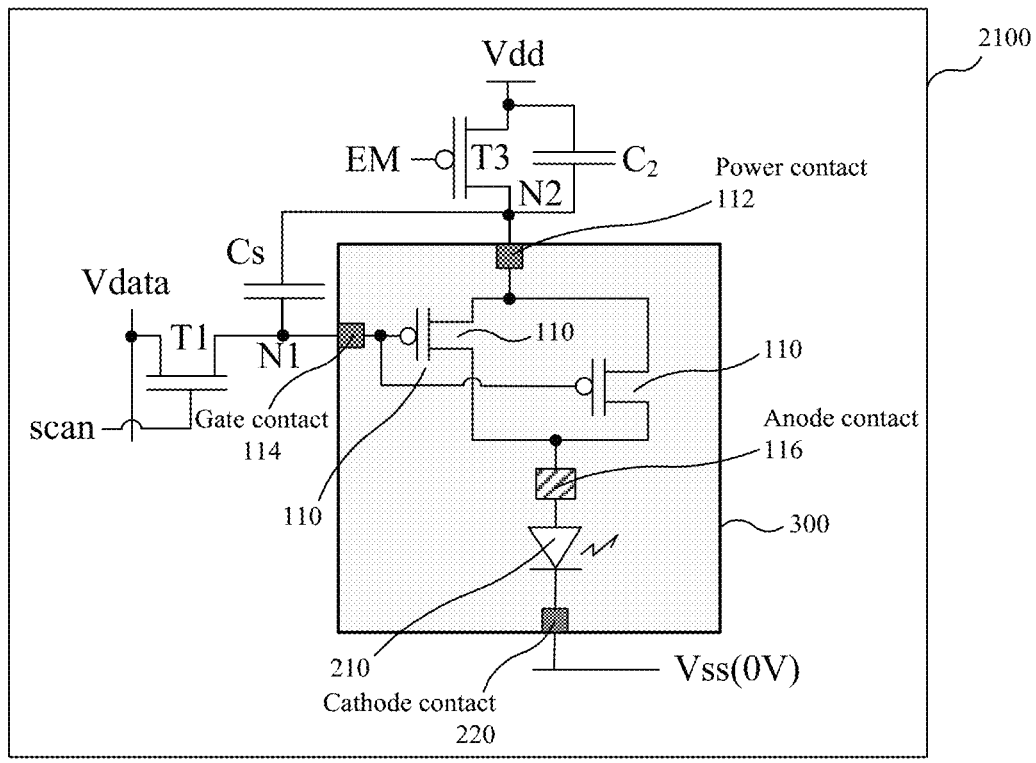
FIG. 4C is a subpixel circuit diagram illustrating a hybrid chiplet including two parallel drive transistors bonded to a display backplane in accordance with an embodiment.
Figure 4D:
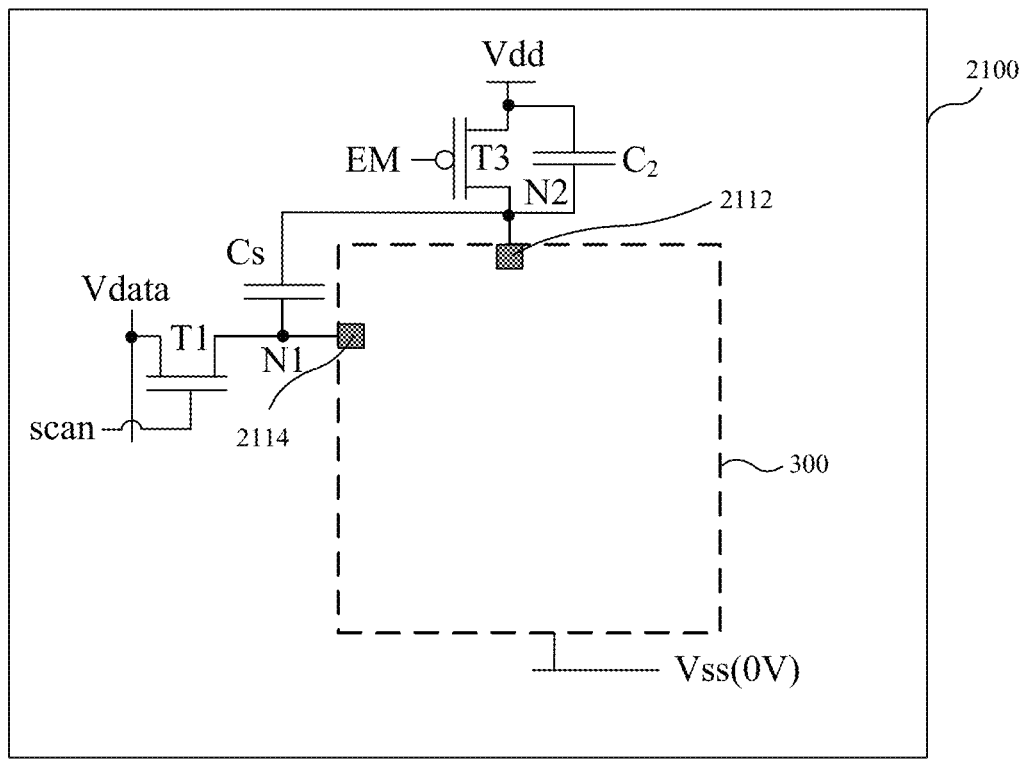
FIG. 4D is a subpixel circuit diagram illustrating the display backplane of FIG. 4C prior to bonding the hybrid chiplet in accordance with an embodiment.

FIG. 4C is a subpixel circuit diagram illustrating a hybrid chiplet 300 including two parallel drive transistors 110 bonded to a display backplane 2100 in accordance with an embodiment. FIG. 4D is a subpixel circuit diagram illustrating the display backplane 2100 of FIG. 4C prior to bonding the hybrid chiplet 300 in accordance with an embodiment. FIGS. 4C-4D are substantially similar to FIGS. 4A-4B with the addition of a second drive transistor 110 connected in parallel with the drive transistor 110 between the power contact 112 and the anode contact 116.

Figure 5A:
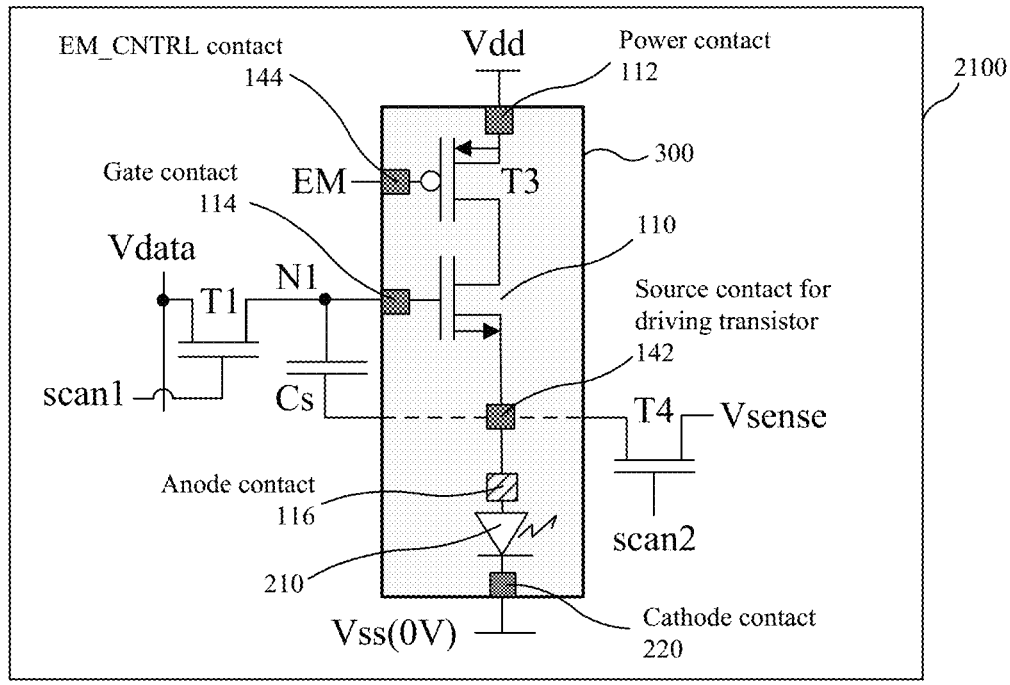
FIG. 5A is a subpixel circuit diagram illustrating a hybrid chiplet including an emission control transistor and a drive transistor bonded to a display backplane in accordance with an embodiment.
Figure 5B:
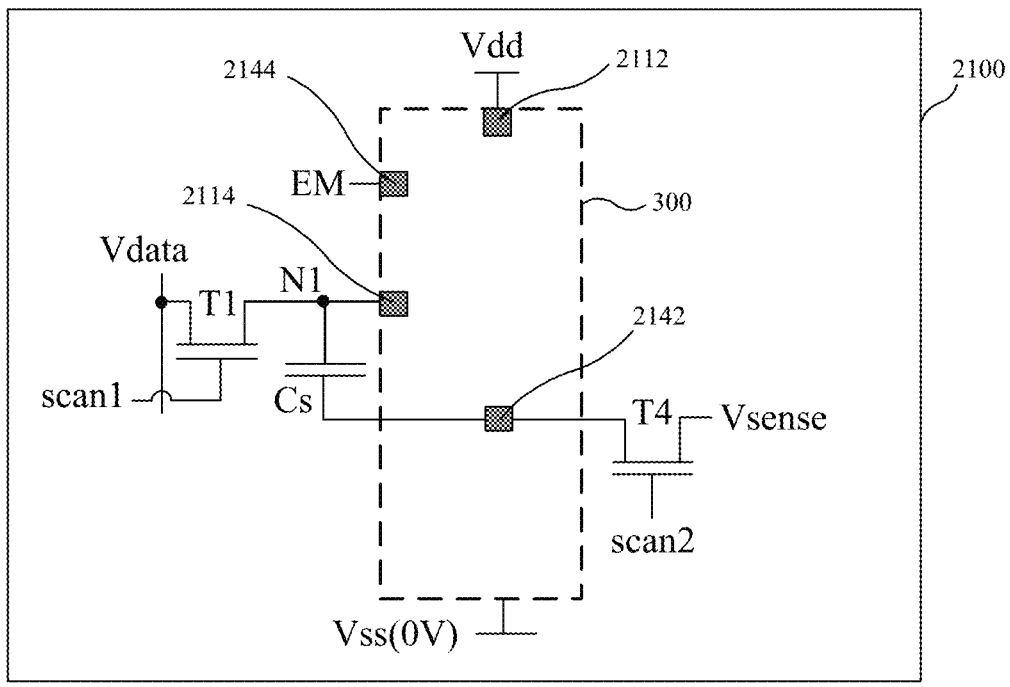
FIG. 5B is a subpixel circuit diagram illustrating the display backplane of FIG. 5A prior to bonding the hybrid chiplet in accordance with an embodiment.

Referring now to FIG. 5A a subpixel circuit diagram is provided illustrating a hybrid chiplet 300 including an emission control transistor (T3) and a drive transistor 110 bonded to a display backplane 2100 in accordance with an embodiment. FIG. 5B is a subpixel circuit diagram illustrating the display backplane 2100 of FIG. 5A prior to bonding the hybrid chiplet 300 in accordance with an embodiment. In the embodiment illustrated in FIG. 5A, the micro driver chiplet 150 includes an emission control transistor (T3) in series with the drive transistor 110, and electrically connected between the drive transistor 110 and the power contact 112. Specifically, a drain terminal of a PMOS emission control transistor (T3) is coupled to a drain terminal of an NMOS drive transistor 110. The bottom side of the micro driver chiplet includes an emission control contact 144 that is electrically connected to a gate terminal of the emission control transistor (T3), and a source contact 142 that is electrically connected to the first source/drain terminal (e.g. source terminal) of the (e.g. NMOS) drive transistor 110 and is electrically connected between the drive transistor 110 and the anode contact 116. In an embodiment, the emission control transistor (T3) may be switched with a lower voltage in the single crystalline silicon in the hybrid chiplet 300, compared to TFT circuitry in the display backplane 2100.

Still referring to FIGS. 5A-5B, the display backplane 2100 circuitry includes a power (Vdd) line coupled to a power input pad 2112, which is open in FIG. 5B, and bonded to the power contact 112 in FIG. 5A. The display backplane 2100 circuitry includes an emission control (EM) line coupled to an emission control input pad 2144, which is open in FIG. 5B, and bonded to the emission control contact 144 in FIG. 5A. In the embodiment illustrated, the display backplane 2100 may include a thin film select transistor (T1), a scan line coupled to a gate terminal of the thin film select transistor, and a data (Vdata) line coupled to a first source/drain terminal of the thin film select transistor (T1). A node (N1) couples a second source/drain terminal of the thin film select transistor (T1), a first terminal of the storage capacitor (Cs), and the selection input pad 2114, which is open in FIG. 5B, and bonded to the gate contact 114 in FIG. 5A. The second terminal of the storage capacitor (Cs) is coupled to a source pad 2142. A switch transistor (T4) may optionally be included in the display backplane 2100 to sense the bias of the storage capacitor (Cs). For example, a Vsense signal and scan2 signal can be applied to the switch transistor (T4) to sense the bias of the storage capacitor (Cs), which is also the Vgs bias across the drive transistor 110 in the hybrid chiplet 300.

In an assembled display, the power contact 112 is bonded to the power input pad 2112, the emission control contact 144 is bonded to the emission control input pad 2144, the gate contact 114 is bonded to the selection input pad 2114, and the source contact 142 for the drive transistor 110 is bonded to the source pad 2142. Prior to assembly of the hybrid chiplet 300, the power input pad 2112, emission control input pad 2144, and selection input pad 2114 are open. The source pad 2142 may optionally be open, or electrically connect the switch transistor (T4) to the storage capacitor (Cs) prior to assembly of the hybrid chiplet 300.

Figure 5C:
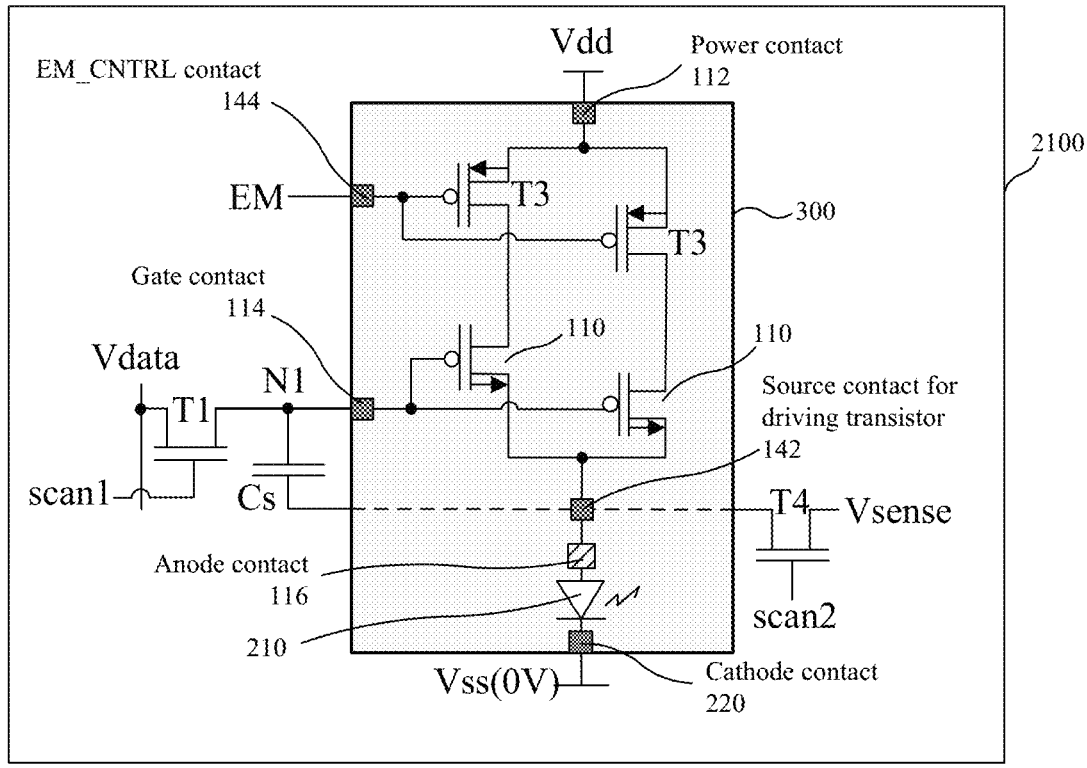
FIG. 5C is a subpixel circuit diagram illustrating a hybrid chiplet including two parallel emission control transistors and two parallel drive transistors bonded to a display backplane in accordance with an embodiment.
Figure 5D:
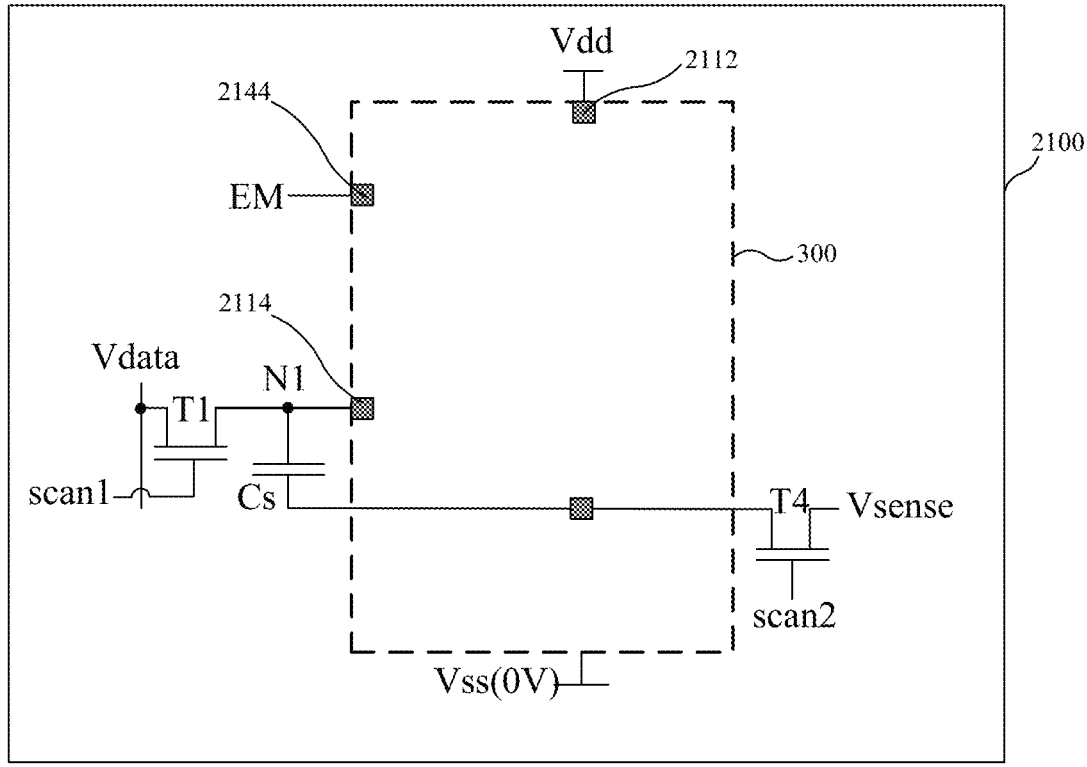
FIG. 5D is a subpixel circuit diagram illustrating the display backplane of FIG. 5C prior to bonding the hybrid chiplet in accordance with an embodiment.

FIG. 5C is a subpixel circuit diagram illustrating a hybrid chiplet 300 including two parallel emission control transistors (T3) and two parallel drive transistors 110 bonded to a display backplane 2100 in accordance with an embodiment. FIG. 5D is a subpixel circuit diagram illustrating the display backplane 2100 of FIG. 5C prior to bonding the hybrid chiplet 300 in accordance with an embodiment. FIGS. 5C-5D are substantially similar to FIGS. 5A-5B with the addition of a pair emission control transistors (T3) and drive transistors 110 in parallel between the power contact 112 and the anode contact 116.

Figure 6A:
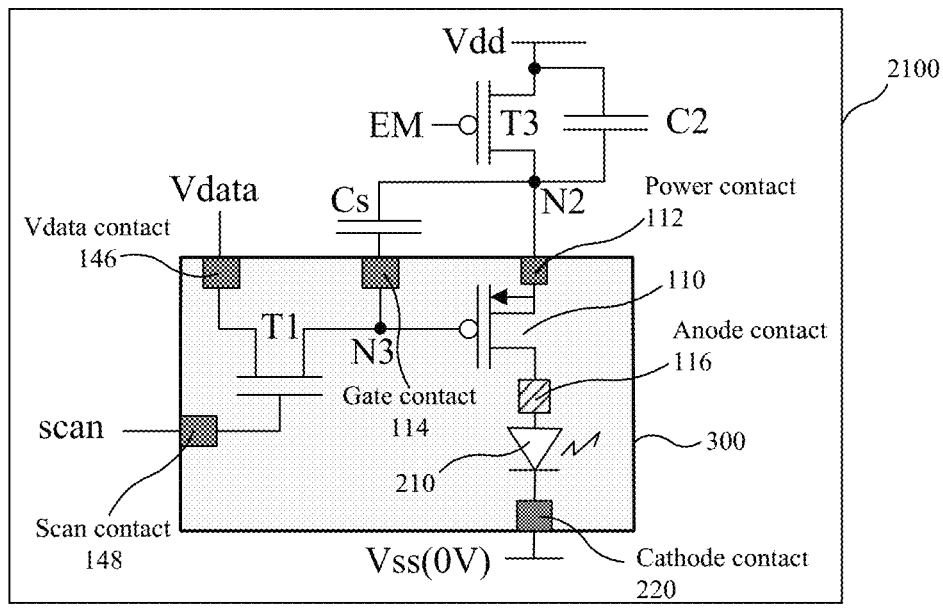
FIG. 6A is a subpixel circuit diagram illustrating a hybrid chiplet including a select transistor and a drive transistor bonded to a display backplane in accordance with an embodiment.
Figure 6B:
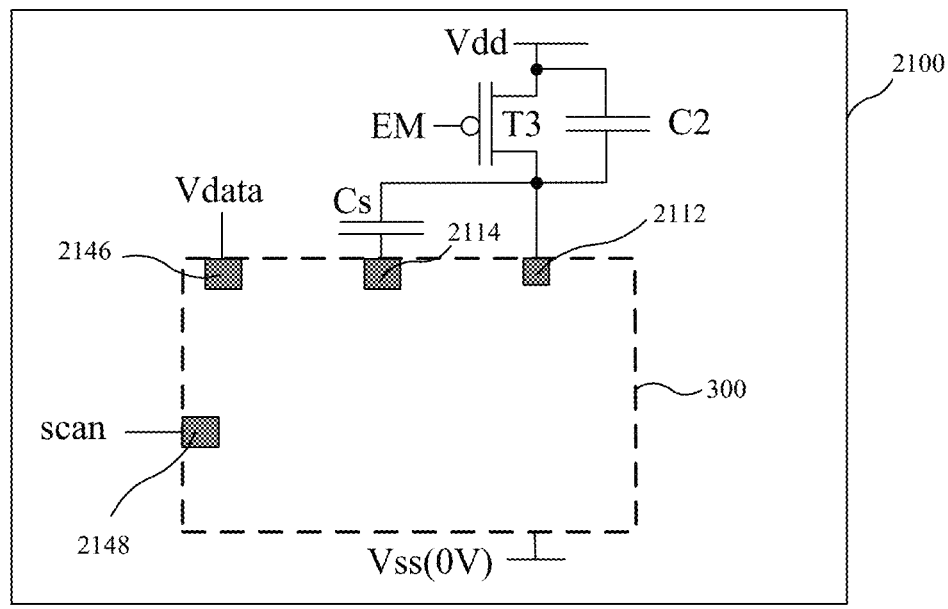
FIG. 6B is a subpixel circuit diagram illustrating the display backplane of FIG. 6A prior to bonding the hybrid chiplet in accordance with an embodiment.

Referring now to FIG. 6A is a subpixel circuit diagram illustrating a hybrid chiplet 300 including a select transistor (T1) and a drive transistor 110 bonded to a display backplane 2100 in accordance with an embodiment. FIG. 6B is a subpixel circuit diagram illustrating the display backplane 2100 of FIG. 6A prior to bonding the hybrid chiplet 300 in accordance with an embodiment. The subpixel circuitry illustrated in FIGS. 6A-6B is substantially similar to that illustrated and described with regard to FIGS. 4A-4B with one difference being the inclusion of the select transistor (T1) in the hybrid chiplet 300. Node (N2) remains on the display backplane 2100 similar to that illustrated and described with regard to FIGS. 4A-4B, however, node (N1) is now located within the hybrid chiplet 300 as node (N3).

The hybrid chiplet 300 illustrated in FIG. 6A includes a scan contact 148 electrically connected with a gate terminal of the select transistor (T1), and a data contact 146 electrically connected with a first source/drain terminal of the select transistor (T1). A node (N3) couples a second source/drain terminal of the select transistor (T1), a gate terminal of the drive transistor 110, and the gate contact 114, which is bonded to the selection input pad 2114 in FIG. 6A, and coupled to a first terminal of the storage capacitor (Cs) on the display backplane 2100.

As shown in FIGS. 6A-6B, the display backplane 2100 may include a thin film emission control transistor (T3), a scan line coupled to scan input pad 2148, a data (Vdata) line coupled to a data input pad 2146, a selection input pad 2114 coupled to a first terminal of a storage capacitor (Cs). The display backplane 2100 may additionally include a thin film emission control transistor (T3). An emission control (EM) line is coupled to a gate terminal of the emission control transistor (T3). A power (Vdd) line is coupled to a first source/drain terminal (e.g. source (S) terminal) of the emission control transistor (T3). A node (N2) is coupled to a second source/drain terminal (e.g. drain (D) terminal) of the thin film emission control transistor (T3), a second terminal of the storage capacitor (Cs), and a power input pad 2112.

In an assembled display, the power contact 112 is bonded to the power input pad 2112, the gate contact 114 is bonded to the selection input pad 2114, and the data contact 146 is bonded to the data input pad 2146, and the scan contact 148 is bonded to the scan input pad 2148. Prior to assembly of the hybrid chiplet 300, the power input pad 2112, selection input pad 2114, data input pad 2146, and the scan input pad 2148 are all open.

Figure 6C:
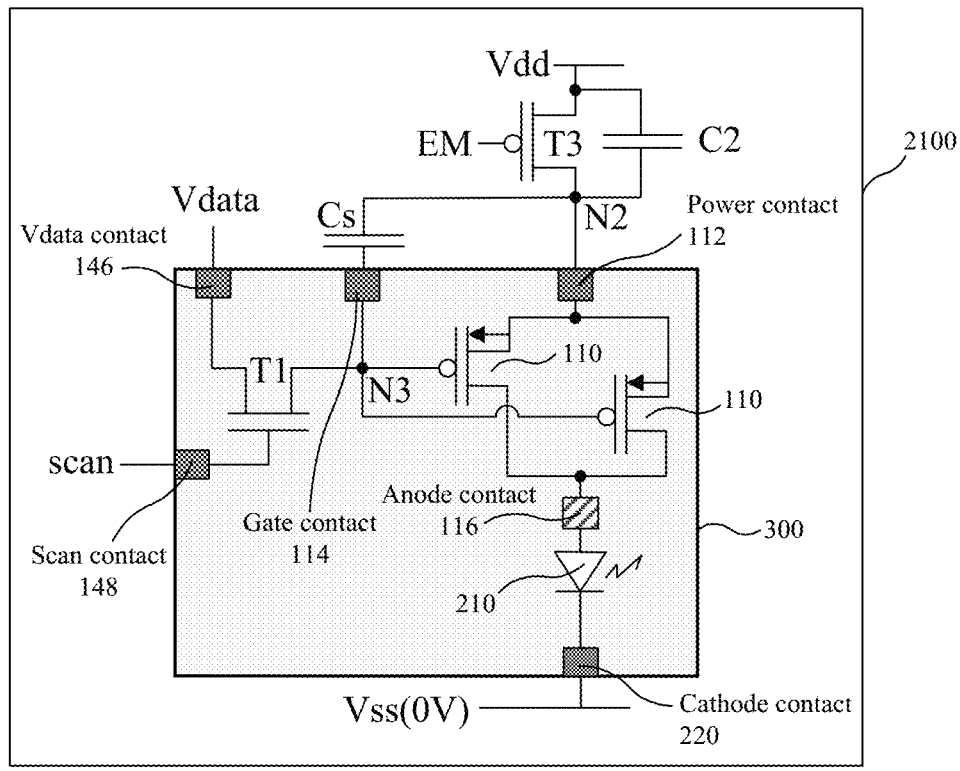
FIG. 6C is a subpixel circuit diagram illustrating a hybrid chiplet including a select transistor and two parallel drive transistors bonded to a display backplane in accordance with an embodiment.
Figure 6D:
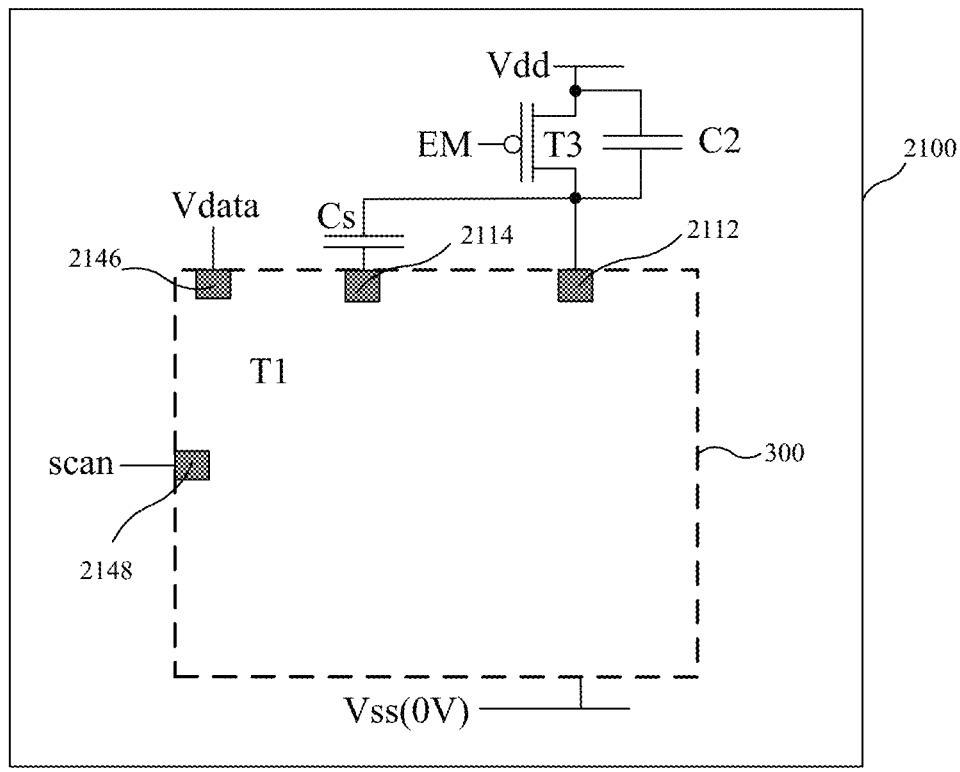
FIG. 6D is a subpixel circuit diagram illustrating the display backplane of FIG. 6C prior to bonding the hybrid chiplet in accordance with an embodiment.

FIG. 6C is a subpixel circuit diagram illustrating a hybrid chiplet 300 including a select transistor (T1) and two parallel drive transistors 110 bonded to a display backplane 2100 in accordance with an embodiment. FIG. 6D is a subpixel circuit diagram illustrating the display backplane 2100 of FIG. 6C prior to bonding the hybrid chiplet 300 in accordance with an embodiment. FIGS. 6C-6D are substantially similar to FIGS. 6A-6B with the addition of a second drive transistor 110 connected in parallel with the drive transistor 110 between the power contact 112 and the anode contact 116.

Figure 6E:
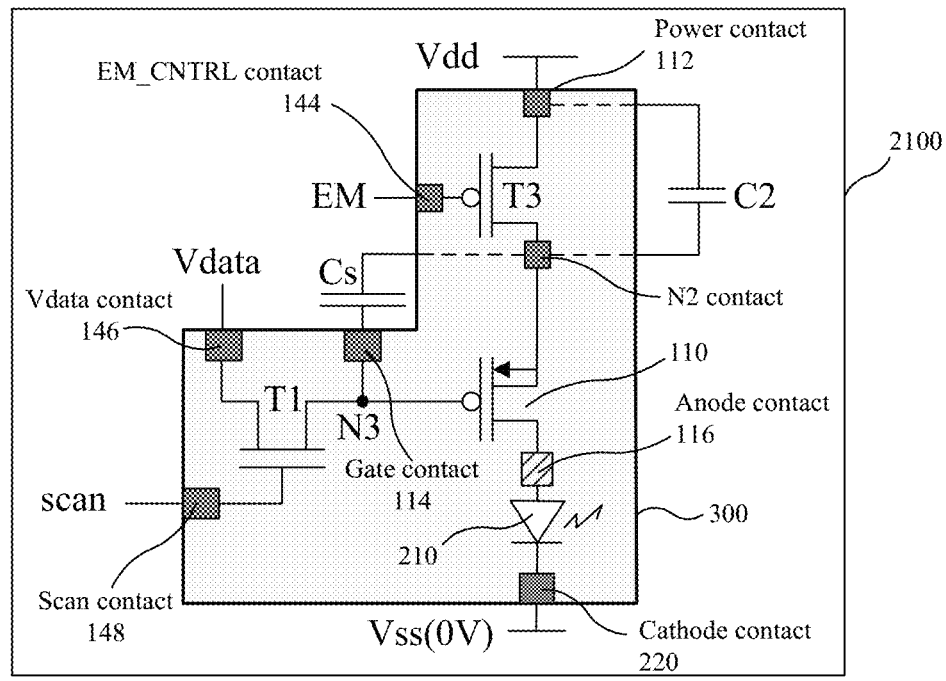
FIG. 6E is a subpixel circuit diagram illustrating a hybrid chiplet bonded to a passive display backplane in accordance with an embodiment.
Figure 6F:
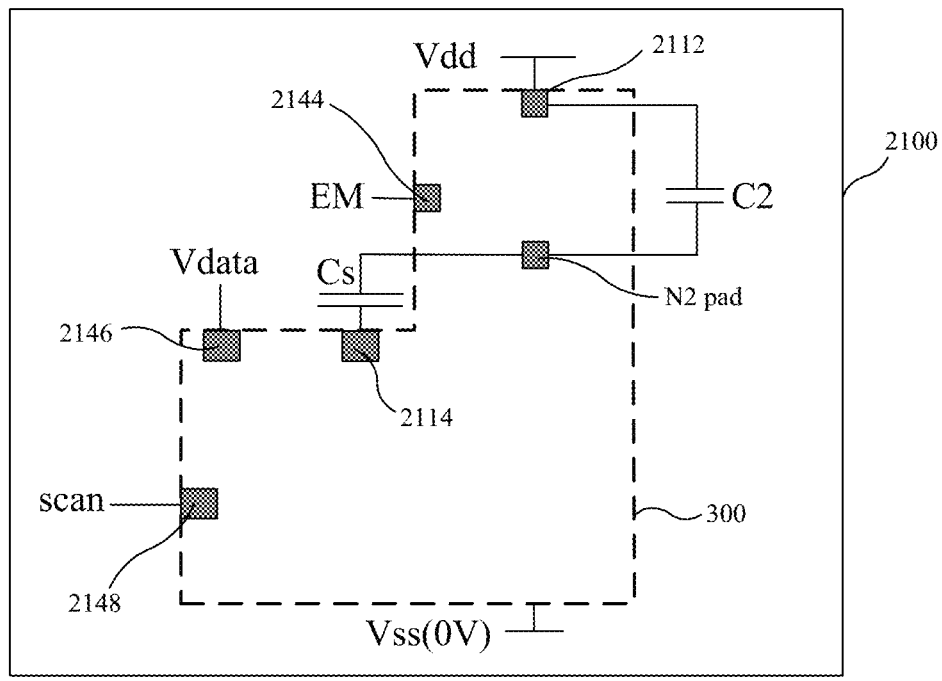
FIG. 6F is a subpixel circuit diagram illustrating the passive display backplane of FIG. 6E prior to bonding the hybrid chiplet in accordance with an embodiment.

Referring now to FIGS. 6E-6F, in an embodiment, a hybrid chiplet 300 may be bonded to a passive display backplane 2100. FIG. 6E is a subpixel circuit diagram illustrating a hybrid chiplet bonded to a passive display backplane in accordance with an embodiment. FIG. 6F is a subpixel circuit diagram illustrating the passive display backplane of FIG. 6E prior to bonding the hybrid chiplet in accordance with an embodiment. FIGS. 6E-6F are similar to FIGS. 6A-6B, with the addition that the emission control (EM) transistor T3 is also included in the hybrid chiplet 300. As shown, the hybrid chiplet includes a node (N2) contact, and an emission control contact 144. The backplane 2100 includes a node (N2) pad that is electrically connected between the storage capacitor (Cs) and capacitor (C2), and an emission control input pad. In an embodiment, the backplane 2100 does not include any transistors within the subpixel circuits, and may only include capacitors.

Figure 7:
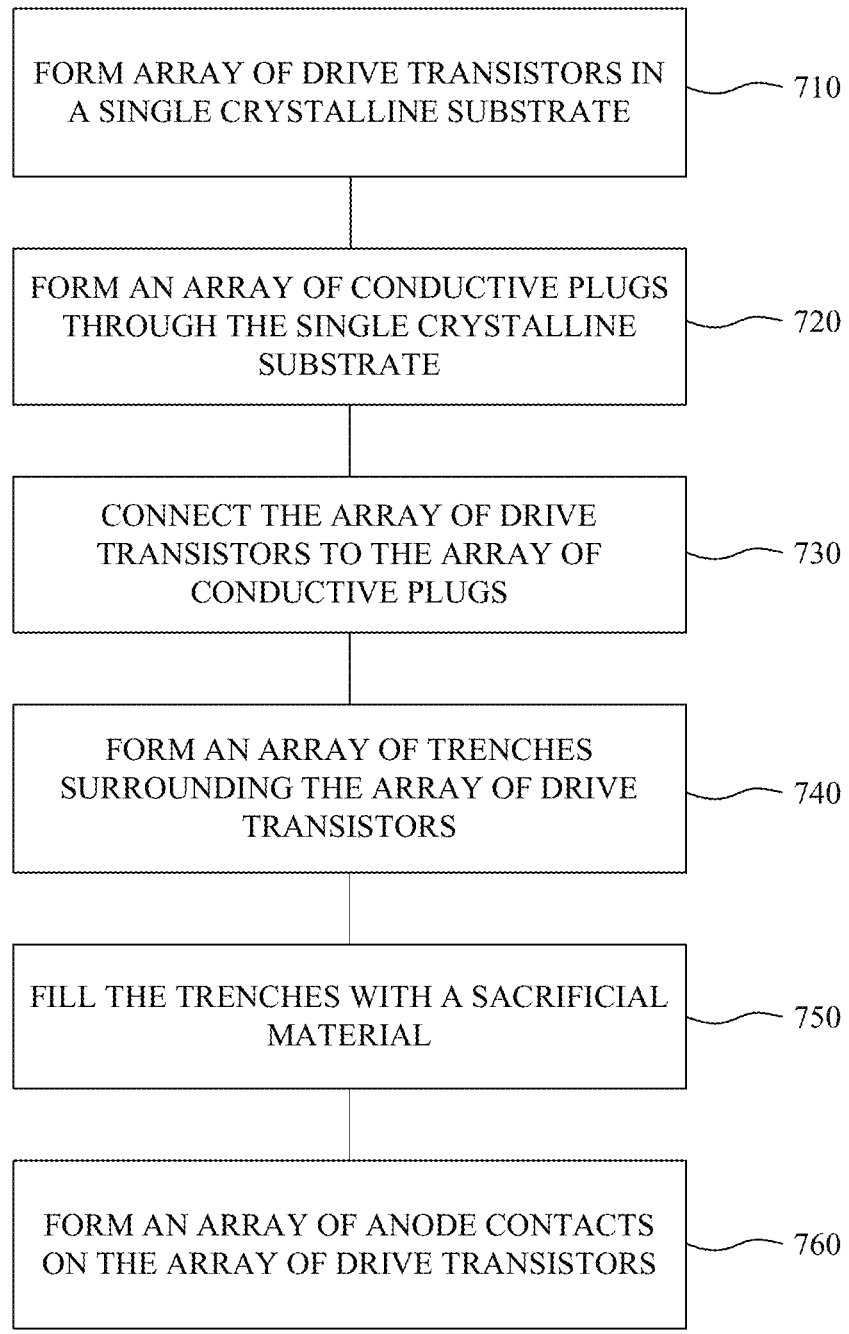
FIG. 7 is a flow chart illustrating method of forming a bulk drive transistor wafer in accordance with an embodiment.

FIG. 7 is a flow chart illustrating method of forming a bulk drive transistor wafer 800 in accordance with an embodiment. FIGS. 8A-8K are schematic cross-sectional side view illustrations of a method of forming a bulk drive transistor wafer 800 in accordance with an embodiment. In interest of clarity, FIGS. 7 and 8A-8K are described concurrently, with reference to the same reference numbers for like features. In addition, it is to be appreciated that the description of the flow chart of FIG. 7 and illustrations in FIGS. 8A-8K are made with regard to the formation of a bulk drive transistor wafer 800 including a single drive transistor 110 in each micro driver chiplet, similar to that illustrated in FIG. 4A. However, this description is intended to be exemplary and embodiments are not limited to such.

Figure 8A:
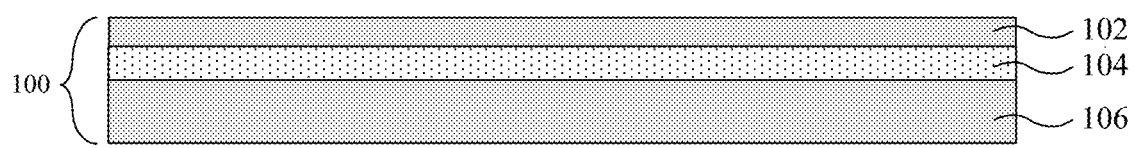
FIGS. 8A-8K are schematic cross-sectional side view illustrations of a method of forming a bulk drive transistor wafer in accordance with an embodiment.
Figure 8B:
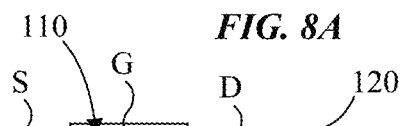
Figure 8C:

At operation 710 an array of drive transistors 110 is formed in a single crystalline substrate 100. For example, the substrate may be a bulk silicon substrate, or a silicon-on-insulator (SOI) substrate. A single crystalline substrate 100 is illustrated in FIG. 8A as including a single crystalline silicon handle wafer 106, optional buried oxide layer 104, and epitaxially grown single crystalline silicon device layer 102. In an embodiment, the device layer is less than 2 microns thick. A conventional front end of the line process may then be used for fabrication of an array of MOS drive transistors 110, and any additional devices to be included within the micro driver chiplets 150. In the embodiment illustrated in FIG. 8B, drive transistor 110 is a PMOS transistor including an n-well 120, channel region 122, p-doped source (S) and drain (D) regions, and gate (G). In other embodiments, the driver transistor 110 may be an NMOS transistor. Silicides may be formed on the gate, source, and drain terminals of the drive transistors 110 to make electrical contact, followed by the formation of interlayer dielectric (ILD-1) 152 over the array of drive transistors 110, as illustrated in FIG. 8C.

Figure 8D:
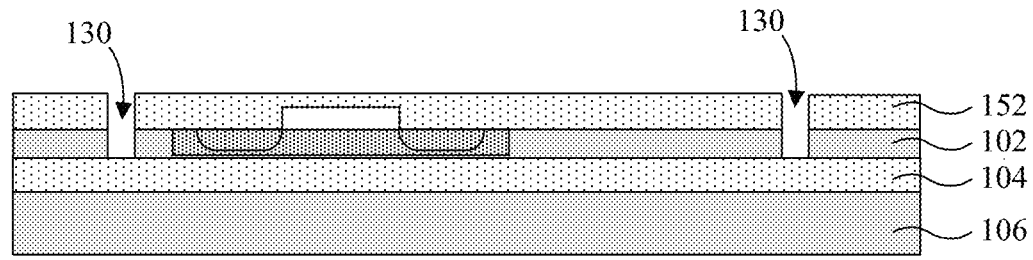
Figure 8E:
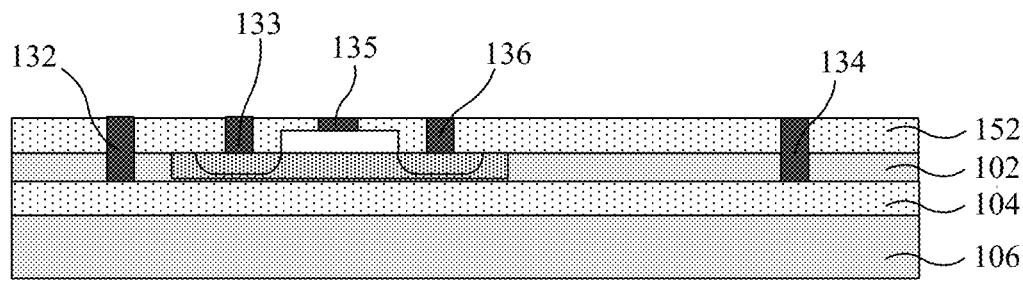

At operation 720 an array of conductive plugs are formed through the single crystalline substrate 100. Specifically, as illustrated in FIG. 8D through vias 130 are first formed at least through interlayer dielectric (ILD-1) 152, and the device layer 102, though the through vias 130 may be formed deeper the single crystalline substrate 100. A barrier layer may then be formed within through vias 130 to prevent electrical shorting, diffusion, etc. Following the formation of through vias 130, additional contact vias may be formed through interlayer dielectric (ILD-1) 152 to contact the source, drain, and gate terminals of the drive transistors 110. Referring now to FIG. 8E, the through vias 130 and contact vias may be filled with a conductive material (e.g. copper or tungsten) to form conductive plugs. Specifically, plugs 132, 133, 134, 135, and 136 are illustrated as previously described with regard to FIG. 1A, though additional pugs may be formed depending upon the devices and circuitry.

Figure 8F:
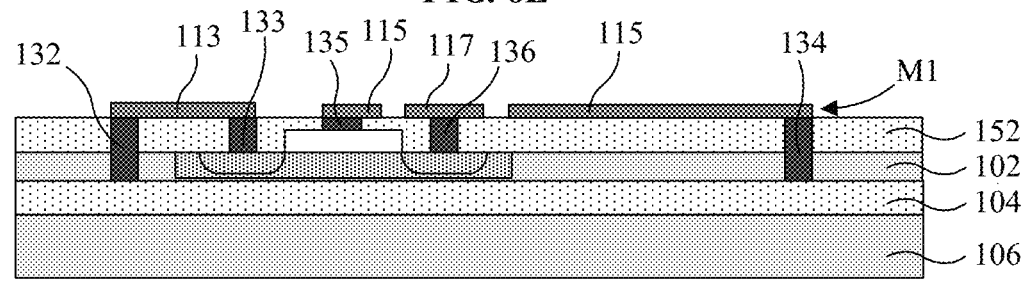
Figure 8G:
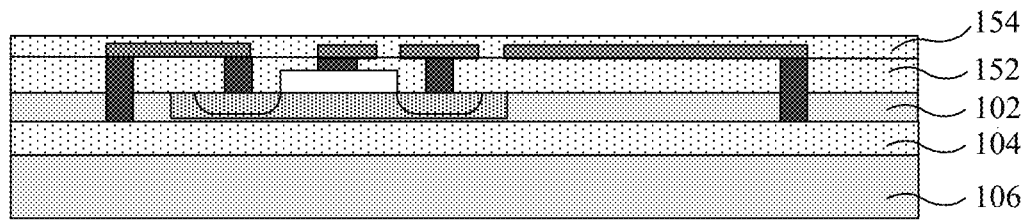

At operation 730 the array of drive transistors 110 is electrically connected to the array of conductive plugs. As shown in FIG. 8F, a first metal layer (M1) may be formed over the interlayer dielectric (ILD-1) 152 to provide electrical connection to the plugs. For example, the first metal layer M1 may be formed of copper or aluminum. Specifically, M1 may be patterned to form interconnect layer 113 electrically connecting plug 132 to plug 133, interconnect layer 115 electrically connecting plug 135 to plug 134, and interconnect layer 117 electrically connected to plug 136. A second interlayer dielectric (ILD-2) 154 may be formed over the M1 interconnect layers 113, 115, 117 to provide electrical insulation as illustrated in FIG. 8G.

Figure 8H:
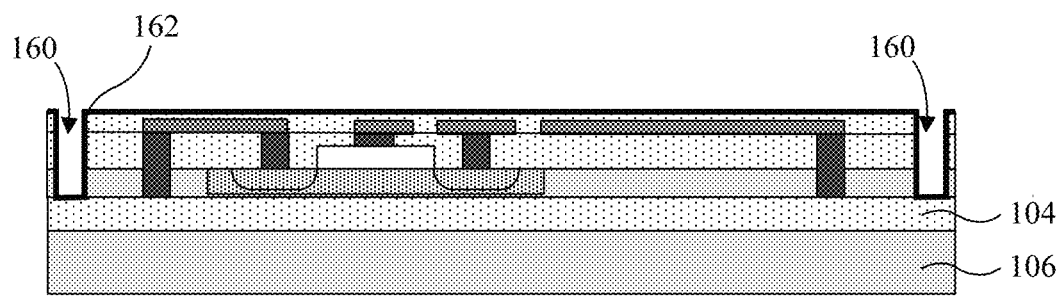

At operation 740 an array of trenches 160 is formed around the array of drive transistors 110, as illustrated in FIG. 8H. Where multiple drive transistors 110, or additional devices, are to be included in the micro driver chiplets, the trenches 160 surround the multiple devices. In an embodiment, a passivation layer 162 is formed over the second interlayer dielectric (ILD-2) 154 and within the trenches 160. For example, the passivation layer 162 may be $AlO_x$, deposited using a suitable technique such as atomic layer deposition (ALD).

Figure 8I:
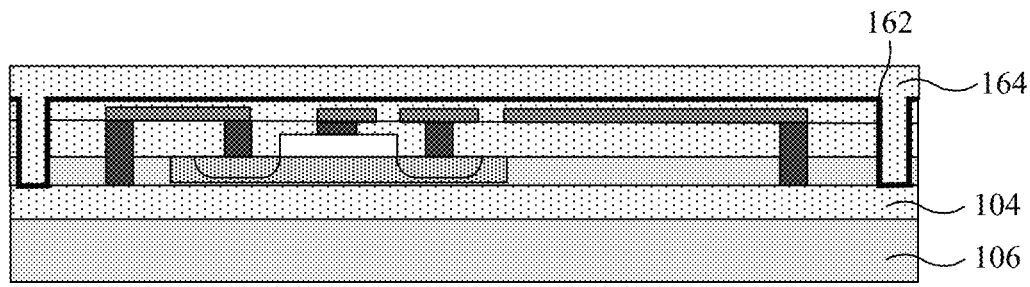
Figure 8J:
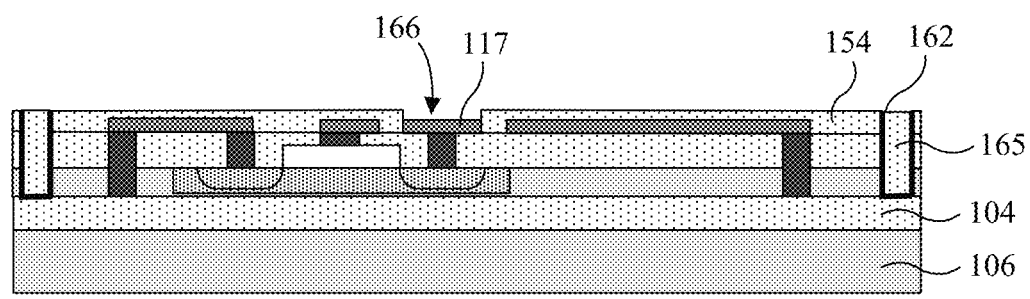

At operation 750 the array of trenches is filled with a sacrificial material 164 as illustrated in FIG. 8I. In an embodiment, the sacrificial material 164 is formed of an oxide (e.g. $SiO_x$) or nitride (e.g. $SiN_x$) though other materials may be used that can be selectively removed with respect to the other layers. In an embodiment, sacrificial material 164 is formed using a technique such as chemical vapor deposition (CVD) that is suitable to fill the aspect ratios of trenches 160. Following deposition of the sacrificial material 164, the sacrificial material 164 may be etched back, or ground using a technique such as chemical mechanical polishing (CMP) to reduce a thickness of the stack. In an embodiment, etch back or grinding may remove passivation layer 162 from the top surface of the second interlayer dielectric (ILD-2) 154. An opening 166 may be formed in the second interlayer dielectric (ILD-2) 154, as illustrated in FIG. 8J to expose the interconnect layer 117.

Figure 8K:
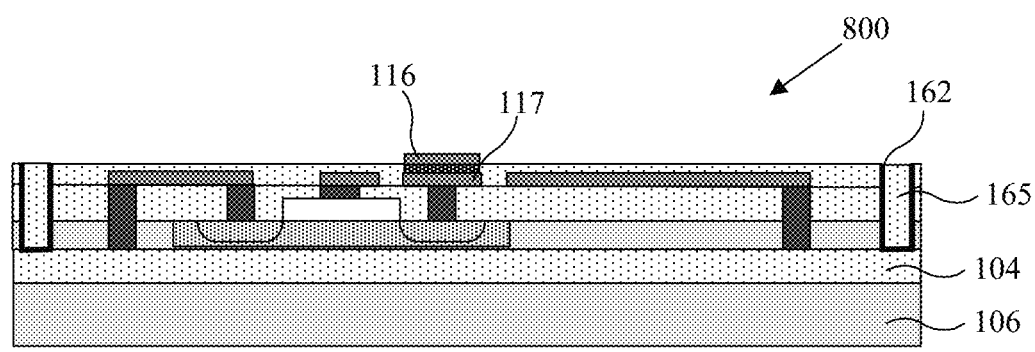

At operation 760 an array of anode contacts 116 is formed on the array of drive transistors 110 resulting in the bulk drive transistor wafer 800 illustrated in FIG. 8K. In an embodiment, anode contacts 116 are formed by a combination of nickel, followed by gold electroless plating. For example, anode contacts 116 may be 0.5-1.0 µm thick stud bumps. Anode contacts 116 may be formed of a layer stack. In an embodiment, a top metal layer (e.g. gold or copper) in the layer stack has a lower melting temperature than a bottom metal layer (e.g. nickel).

Figure 9:
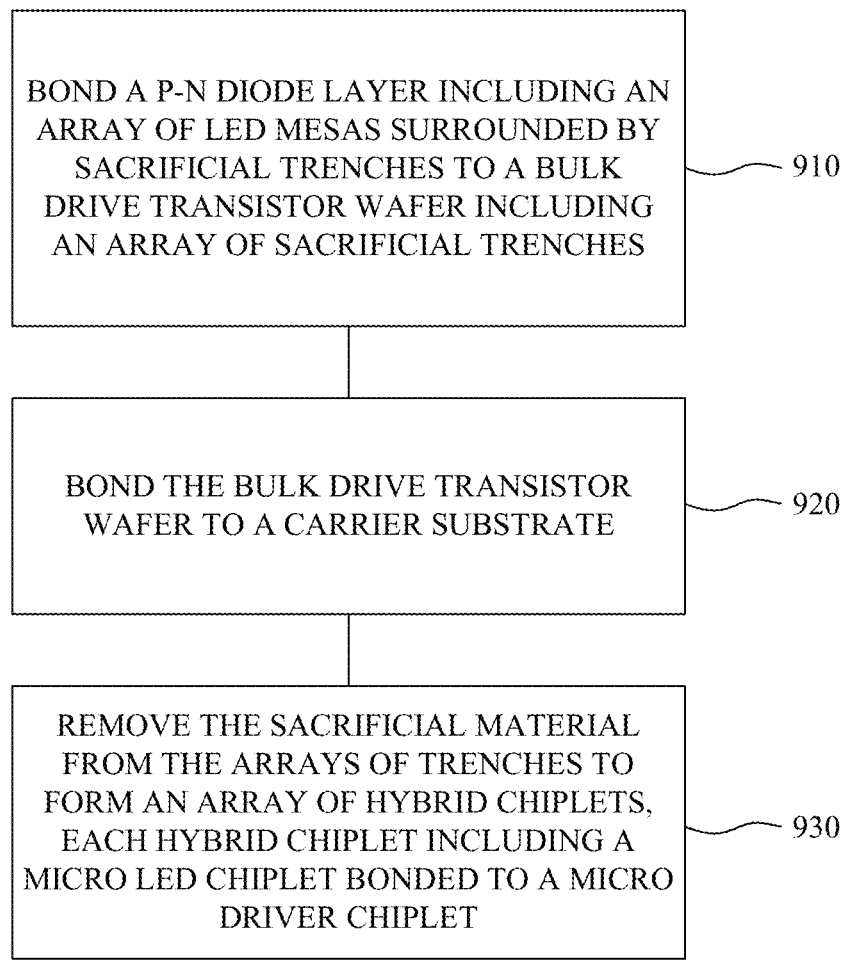
FIG. 9 is a flow chart illustrating method of forming an array of hybrid chiplets with pre-formed sacrificial trenches in the bulk substrates in accordance with an embodiment.

FIG. 9 is a flow chart illustrating method of forming an array of hybrid chiplets 300 with pre-formed sacrificial trenches in the bulk substrates in accordance with an embodiment. FIGS. 10A-10I are schematic cross-sectional side view illustrations of a method of forming an array of hybrid chiplets 300 with pre-formed sacrificial trenches in the bulk substrates in accordance with an embodiment. In interest of clarity, FIGS. 9 and 10A-10I are described concurrently, with reference to the same reference numbers for like features. In addition, it is to be appreciated that the description of the flow chart of FIG. 9 and illustrations in FIGS. 10A-10I are made with regard to the formation of hybrid chiplets 300 including a single drive transistor 110 in each micro driver chiplet, similar to that illustrated in FIG. 4A. However, this description is intended to be exemplary and embodiments are not limited to such.

Figure 10A:
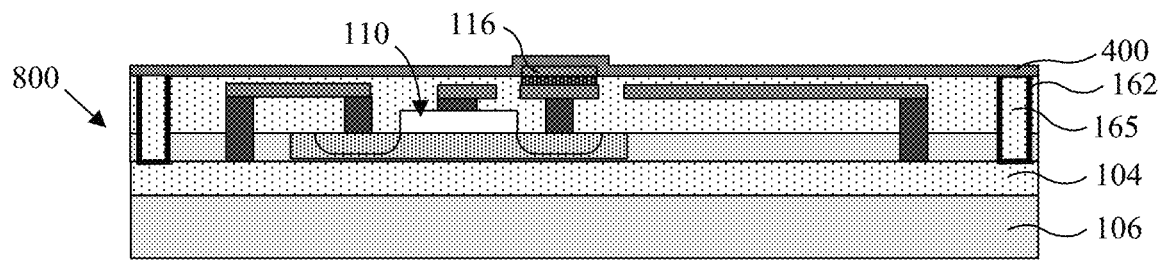
FIGS. 10A-10I are schematic cross-sectional side view illustrations of a method of forming an array of hybrid chiplets with pre-formed sacrificial trenches in the bulk substrates in accordance with an embodiment.
Figure 10B:
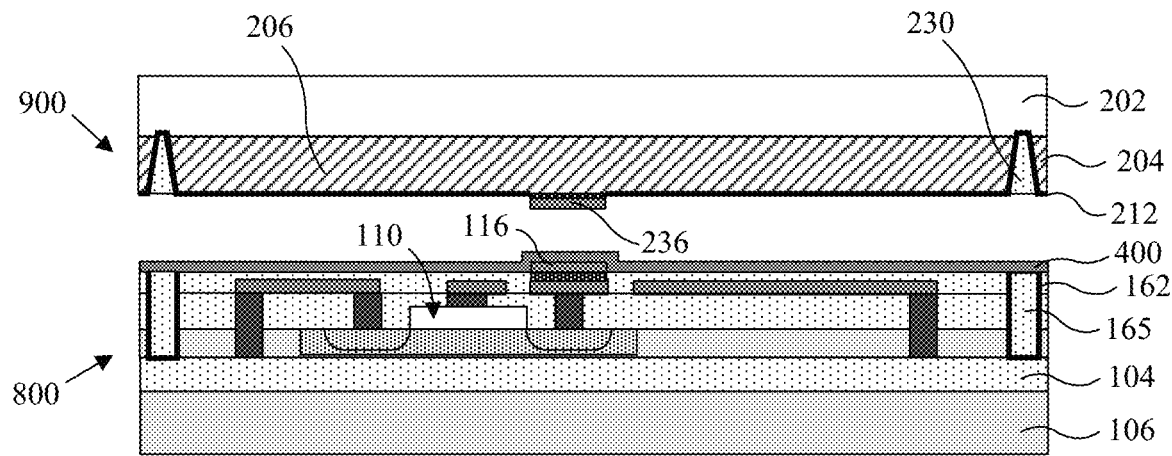

At operation 910 a p-n diode layer 204 including an array of LED mesas 206 surrounded by sacrificial trenches (e.g. trenches filled with sacrificial material 230) is bonded to a bulk drive transistor wafer 800 including an array of sacrificial trenches (e.g. trenches filled with sacrificial material 165). FIG. 10A is a cross-sectional side view illustration of layer of polymer bonding material 400 formed over a bulk drive transistor wafer 800 in accordance with an embodiment. Polymer bonding material 400 may be a B-stage thermoset material, such as benzocyclobutene (BCB) in an embodiment. As shown the polymer bonding material 400 may cover the anode contacts 116. Referring now to FIG. 10B, p-n diode layer 204 may be supported by a support substrate 202 as part of an LED substrate stack 900. In one embodiment, support substrate 202 is a growth substrate. In one embodiment, the support substrate is a silicon wafer. In such an embodiment, the p-n diode layer 204 may be bonded to the silicon wafer with an adhesive bonding material such as BCB. In such an embodiment, an original growth substrate may be removed from the p-n diode layer 204 after bonding to the silicon wafer. The p-n diode layer 204 may additionally be thinned to the approximate thickness of the vertical micro LED 210. The p-n diode layer 204 may be designed for emission of primary red light (e.g. 620-750 nm wavelength), primary green light (e.g. 495-570 nm wavelength), or primary blue light (e.g. 450-495 nm wavelength), though embodiments are not limited to these exemplary emission spectra. The p-n diode layer 204 may be formed of a variety of compound semiconductors having a band gap corresponding to a specific region in the spectrum. For example, the p-n diode layer 204 can include one or more layers based on II-VI materials (e.g. ZnSe) or III-V materials including III-V nitride materials (e.g. GaN, AlN, InN, InGaN, and their alloys) and III-V phosphide materials (e.g. GaP, AlGaInP, and their alloys). The support substrate 202 may include any suitable substrate such as, but not limited to, silicon, SiC, GaAs, GaN, and sapphire. In an embodiment, a silicon wafer support substrate 202 may aid in matching thermal expansion to the bulk drive transistor wafer 800 and single crystalline substrate 100.

In the particular embodiment illustrated, trenches are formed within the p-n diode layer 204 and filled with a sacrificial material 230 to from sacrificial trenches. A passivation layer 212, such as $AlO_x$ may be formed along sidewalls of the trenches prior to depositing the sacrificial material 230. The passivation layer 212 may optionally be formed along the exposed bottom surface of the p-n diode layer 204, and include an opening for a bottom LED contact 236. In an embodiment, bottom LED contact 236 includes a layer stack. In an embodiment, the outermost layer is formed of a metal (e.g. gold or copper) with a comparatively lower melting temperature compared to the other layers in the metal stack.

Figure 10C:
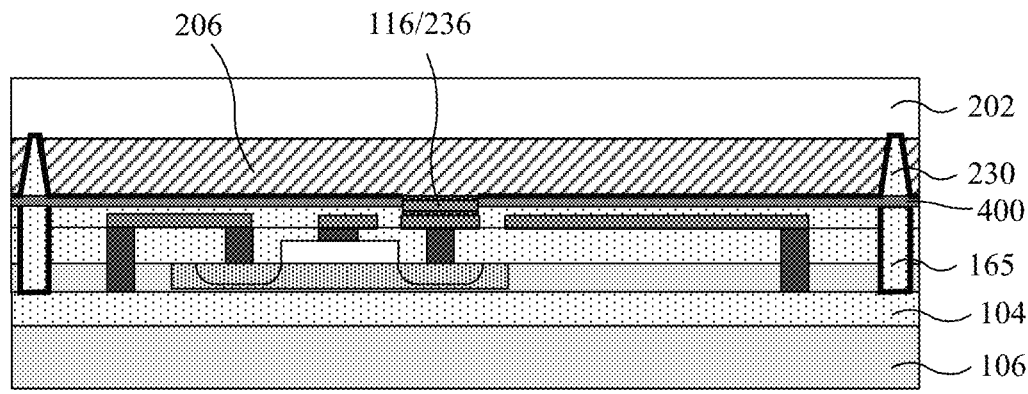

Referring now to FIG. 10C the LED substrate stack 900 is bonded to the bulk drive transistor wafer 800. In an embodiment, bonding includes punching the bottom LED contacts 236 through the polymer bonding material 400 to contact corresponding anode contacts 116. Bonding may be achieved using metal-metal thermal compression bonding of the gold or copper bottom LED contacts 236 and anode contacts 116. Heat may additionally be applied to cure the polymer bonding material 400 (e.g. final cure the B-staged thermoset material). As shown in FIG. 10C, the sacrificial trenches of the LED substrate stack 900 (e.g. trenches filled with sacrificial material 230) are aligned directly over the sacrificial trenches of the bulk drive transistor wafer 800 (e.g. trenches filled with sacrificial material 165).

Figure 10D:
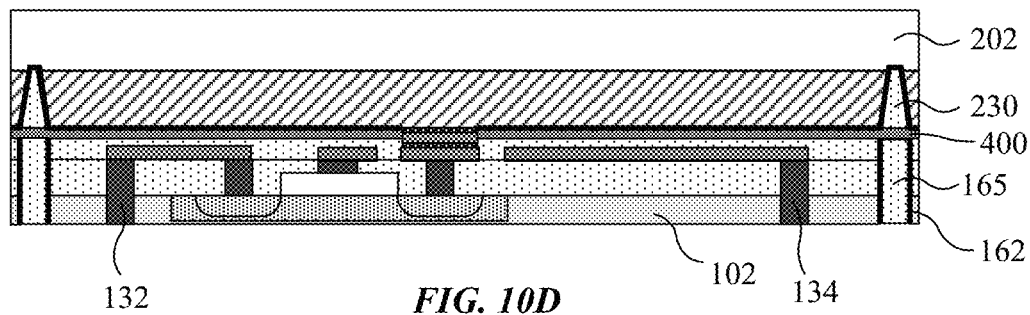

A thickness of the bulk drive transistor wafer 800 is then reduced from the back side as illustrated in FIG. 10D. In the particular embodiment illustrated, where single crystalline substrate 100 is an SOI substrate, the handle wafer 106 can be removed by back grinding to the buried oxide layer 104, followed by removal of the buried oxide layer 104 with a wet buffered oxide etch. The passivation layer 162 remaining at the bottom of the filled trenches 160 may then be removed with a wet etch such as HCl to expose the sacrificial material 165. In an embodiment, the resultant structure illustrated in FIG. 10D includes exposed conductive plugs 132, 134 and an exposed sacrificial material 165 in the filled trenches 160.

Figure 10E:
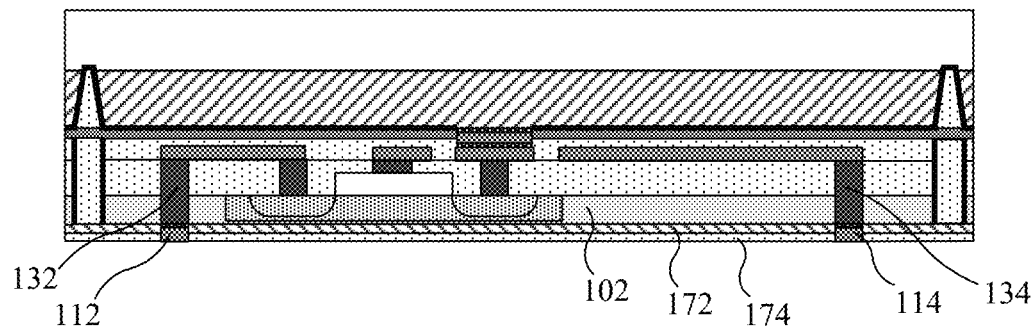

Referring now to FIG. 10E, bottom chiplet contacts are formed, for example, for electrical connection with the source and gate terminals of the drive transistor. In the embodiment illustrated, a barrier layer 172 (e.g. $SiN_x$) is first formed on the back side of the device layer 102. A sacrificial layer 174 (e.g. $SiO_x$) is then formed on the barrier layer 172.

Openings are then formed through barrier layer and sacrificial layer 174 to expose the conductive plugs (e.g. 132, 134) that are formed through the device layer 102. Chiplet contacts (e.g. 112, 114, etc.) are then formed within the openings. For example, chiplet contacts (e.g. 112, 114, etc.) may be formed by a combination of nickel, followed by gold electroless plating. For example, the chiplet contacts may be 0.5-1.0 μm thick stud bumps. The chiplet contacts may be formed of a layer stack. In an embodiment, a top metal layer (e.g. gold) in the layer stack has a lower melting temperature than a bottom metal layer (e.g. nickel). In an embodiment, the top metal layer is chosen for its adhesion properties with the stabilization layer yet to be formed, and diffusion/alloy characteristics with a bonding layer to be formed on a display backplane contact pads.

Figure 10F:
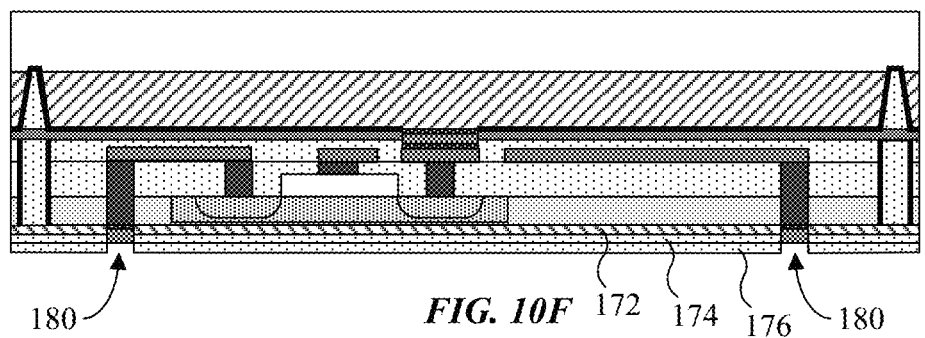

As illustrated in FIG. 10F, a second sacrificial layer 176 (e.g. $SiO_x$) may then optionally be formed over the first sacrificial layer 174, and patterned to form openings 180 exposing any chiplet contacts (e.g. 112, 114, etc.) that will be supported by support posts. In accordance with some embodiments all chiplet contacts (e.g. 112, 114, etc.) are exposed with openings 180. In accordance with some embodiments, not all chiplet contacts are exposed with openings 180.

Figure 10G:
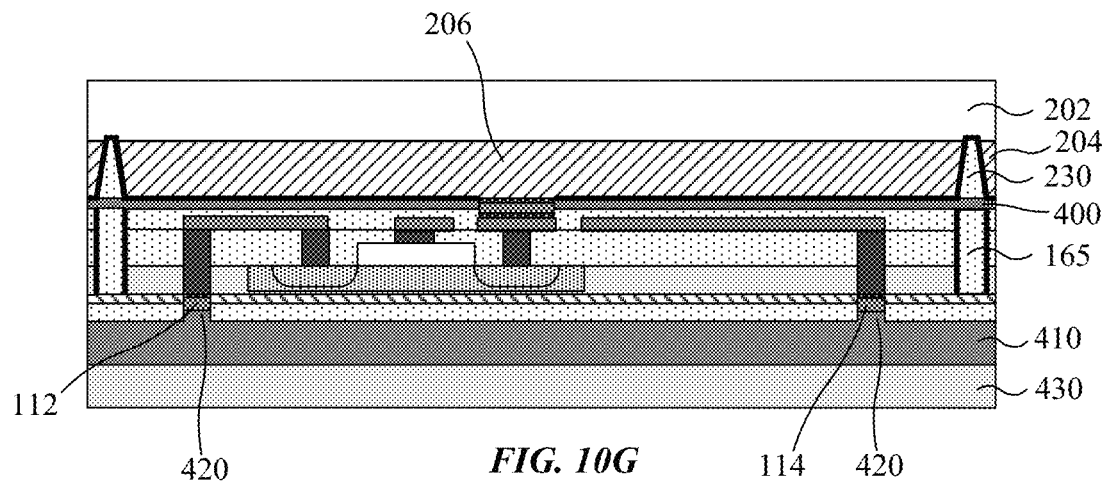

At operation 920 the bulk drive transistor wafer 800 is bonded to a carrier substrate 430. Referring to FIG. 10G, a stabilization layer 410 is coated onto either the bulk drive transistor wafer 800 or the carrier substrate 430. After application, of the stabilization layer 410, the stabilization layer 410 may be pre-baked to remove solvents, resulting in a B-staged layer. The substrates may then be brought together, with the stabilization layer 410 filling the openings 180 and forming stabilization posts 420 on the chiplet contacts (e.g. 112, 114, etc.). In an embodiment, stabilization layer is formed of a thermoset material, such as benzocyclobutene (BCB), which can be fully cured during bonding.

Figure 10H:
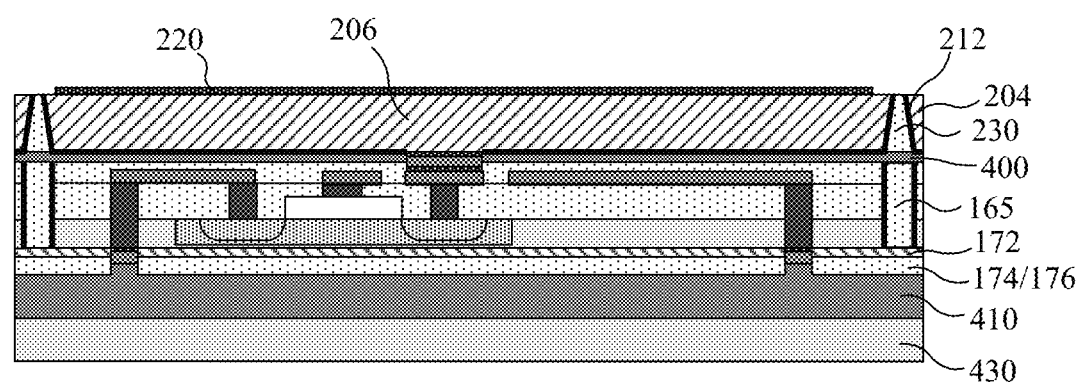

Referring to FIG. 10H, the support substrate 202 may then be removed from the p-n diode layer 204 using suitable techniques such as laser lift-off, grinding, and/or etching. During this process, the passivation layer 212 may be removed from the top of the filled trenches in the p-n diode layer 204 to expose the sacrificial material 230. An array of top LED contacts 220 may be formed on the exposed array of LED mesas 206.

At operation 930 the sacrificial material (e.g. 230, 165) is removed from the arrays of trenches to form an array of hybrid chiplets 300, each hybrid chiplet 300 including a micro LED chiplet 250 bonded to a micro driver chiplet 150. In an embodiment, removal of the sacrificial material may include several operations. For example, a vapor HF release may be performed to remove sacrificial material 230 and expose the polymer bonding material 400, followed by an oxygen plasma ash to remove the exposed polymer bonding material 400, followed by a second vapor HF release etch to remove sacrificial material 165. A wet etch operation may then be performed to etch through the exposed barrier layer 172 (e.g. $SiN_x$), followed by a third vapor HF release to remove the sacrificial layers 174, 176 from underneath the array of hybrid chiplets 300, resulting in the structure illustrated in FIG. 10I.

Figure 10I:
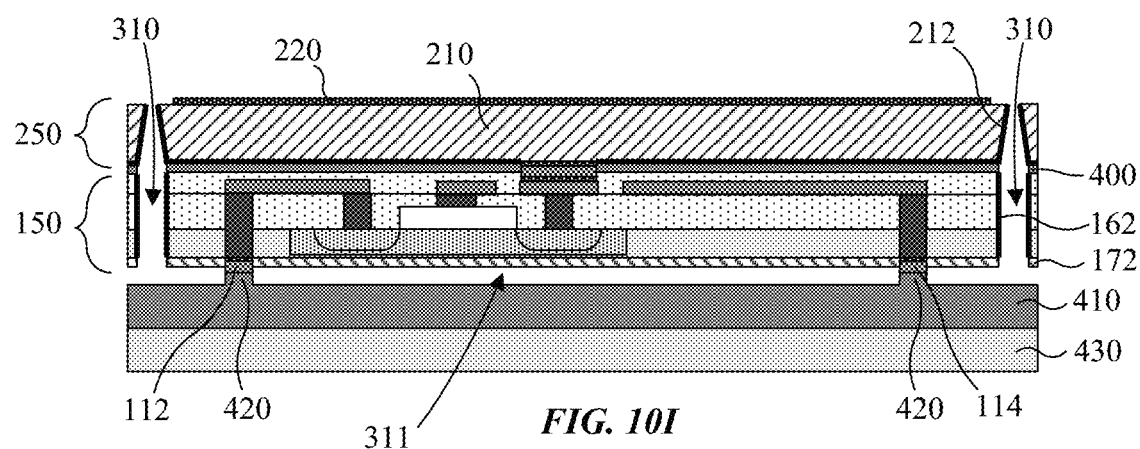

In the embodiment illustrated in FIG. 10I, a first passivation layer 212 spans sidewalls of the vertical micro LED 210 (and micro LED chiplet 250), and a second passivation layer 162 spans sidewalls of the micro driver chiplet 150. The first passivation layer 212 may additional span along the bottom surface of the vertical micro LED 210. The passivation layers 212, 162 may protect the micro LED chiplet 250 and micro driver chiplet 150 during removal of the sacrificial materials/layers 230, 165, 174, 176 as well as during or after integration on the display backplane. As illustrated, the resulting array of hybrid chiplets 300 are surrounded by open trenches 310, with cavities 311 spanning beneath the hybrid chiplets 300, which are supported by an array of support posts 420 of the stabilization layer 410. The hybrid chiplets 300 illustrated in FIG. 10I are poised for pick up and transfer to a display substrate.

Figure 11:
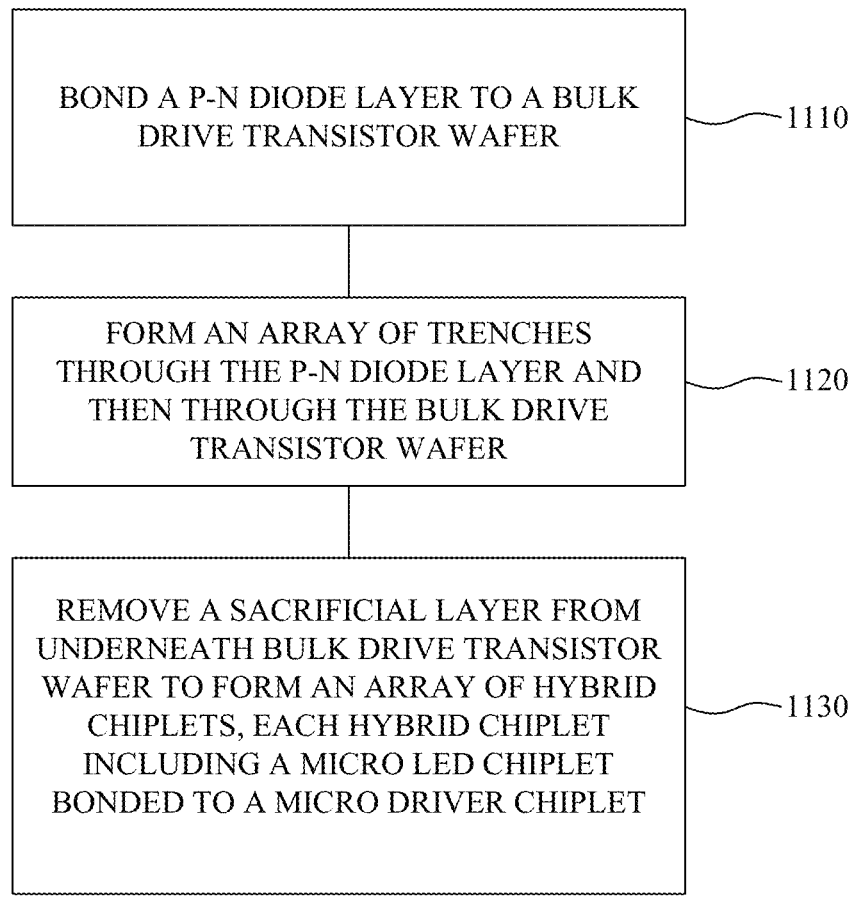
FIG. 11 is a flow chart illustrating method of forming an array of hybrid chiplets with a top-side trench last approach in accordance with an embodiment.

FIG. 11 is a flow chart illustrating method of forming an array of hybrid chiplets 300 with a top-side trench last approach in accordance with an embodiment. In a top-side trench last approach is may not be necessary to fill the trenches with a sacrificial material. FIGS. 12A-12D are schematic cross-sectional side view illustrations of a method of forming an array of hybrid chiplets 300 with a top-side trench last approach in accordance with an embodiment. In interest of clarity, FIGS. 11 and 12A-12D are described concurrently, with reference to the same reference numbers for like features. In addition, it is to be appreciated that the description of the flow chart of FIG. 11 and illustrations in FIGS. 12A-12D are made with regard to the formation of hybrid chiplets 300 including a single drive transistor 110 in each micro driver chiplet, similar to that illustrated in FIG. 4A. However, this description is intended to be exemplary and embodiments are not limited to such.

Figure 12A:
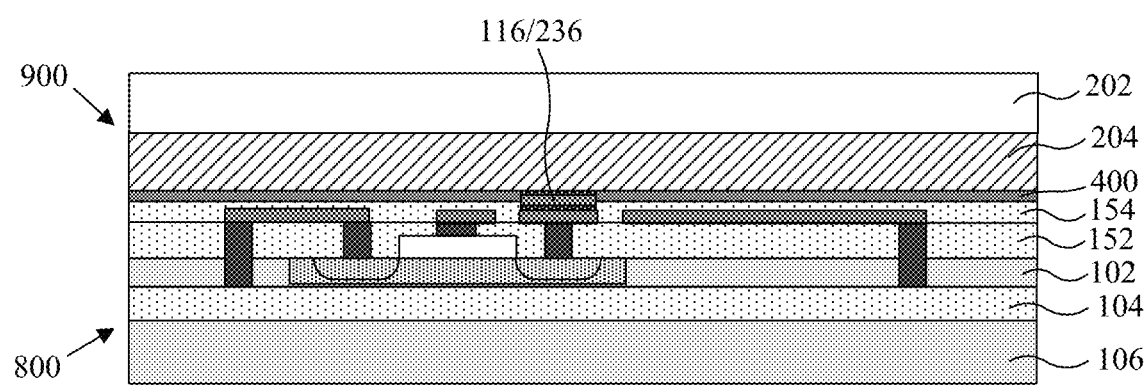
FIGS. 12A-12D are schematic cross-sectional side view illustrations of a method of forming an array of hybrid chiplets with a top-side trench last approach in accordance with an embodiment.

At operation 1110 a p-n diode layer 204 is bonded to a bulk drive transistor wafer 800. Bonding is performed similarly as described with regard to FIGS. 10A-10C, with one difference being that sacrificial trenches have not been formed in the p-n diode layer 204 and the bulk drive transistor wafer 800. FIG. 12A is a schematic cross-sectional side view illustration of a p-n diode layer 204 bonded to a bulk drive transistor wafer 800 in accordance with an embodiment. In an embodiment, bonding includes punching the bottom LED contacts 236 through the polymer bonding material 400 to contact corresponding anode contacts 116, and bonding the bottom LED contacts 236 to the corresponding anode contacts 116 with metal-metal bonds.

Figure 12B:
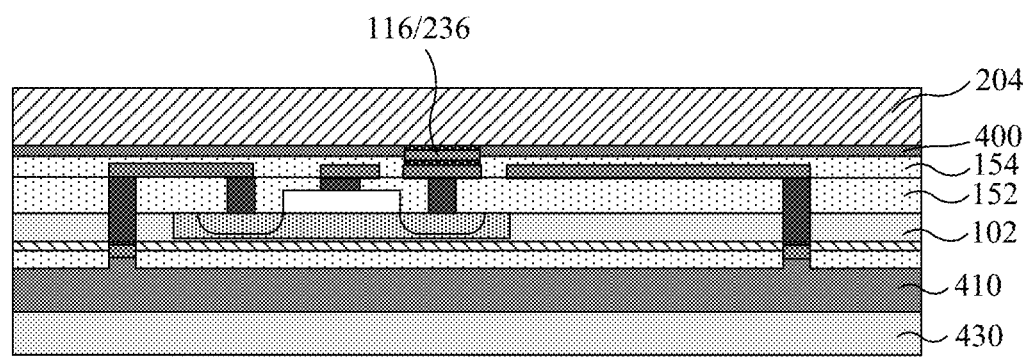

Referring to FIG. 12B, following bonding of the p-n diode layer 204 to the a bulk drive transistor wafer 800, a thickness of the bulk drive transistor wafer 800 may then be reduced, bottom chiplet contacts formed, and the back side of the modified bulk drive transistor wafer may then be bonded to a carrier substrate 430 with a stabilization layer similarly as described with regard to FIGS. 10D-10G. The support substrate 202 may be removed, and a thickness of the p-n diode layer 204 optionally reduced to a determined amount.

Figure 12C:
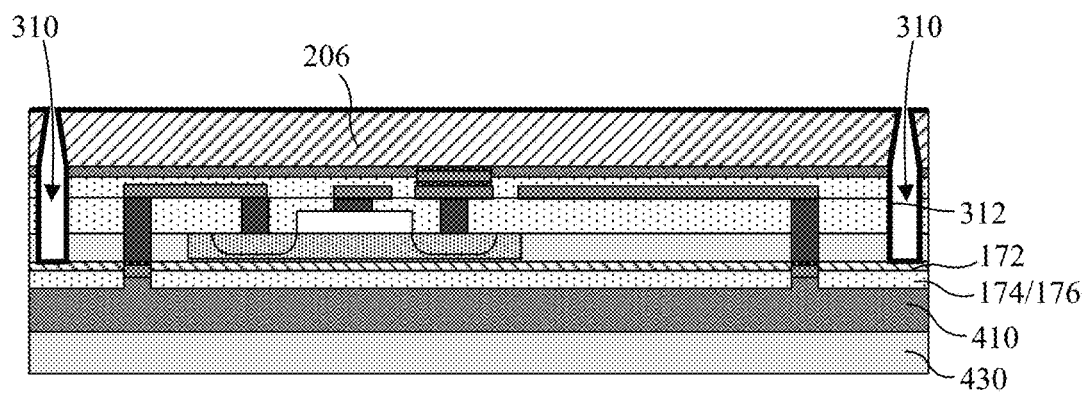

At operation 1120 an array of trenches 310 is formed through the p-n diode layer 204 and then though the bulk drive transistor wafer 800. As illustrated in FIG. 12C, the trenches 310 may be formed through the device layer 102 of the bulk drive transistor wafer 800. The formation of trenches 310 also defines the array of LED mesas 206. Following the formation of trenches 310, a passivation layer 312 may be formed within the trenches 310, and optionally over the array of LED mesas 206. For example, the passivation layer 162 may be $AlO_x$, deposited using a suitable technique such as atomic layer deposition (ALD).

Where the passivation layer 162 is formed over the array of LED mesas 206, the passivation layer 162 may then be subsequently removed from the top surface of the array of LED mesas 206 using a sputter etch technique. In an embodiment, a sputter etch operation is performed to remove the passivation layer 162 from the bottom surface of the trenches 310 to expose the barrier layer 172. Top LED contacts 220 may then be formed on the exposed top surfaces of the array of LED mesas 206.

At operation 1130 a sacrificial layer 174, 176 is removed from underneath the bulk drive transistor wafer to form an array of hybrid chiplets 300, each hybrid chiplet 300 including a micro LED chiplet 250 bonded to a micro driver chiplet 150. In an embodiment, prior to removal of the sacrificial layer 174, 176 a wet etch operation may then be performed to etch through the exposed barrier layer 172 (e.g. SiN$_x$), followed by a vapor HF release to remove the sacrificial layers 174, 176 from underneath the array of hybrid chiplets 300, resulting in the structure illustrated in FIG. 12D.

Figure 12D:
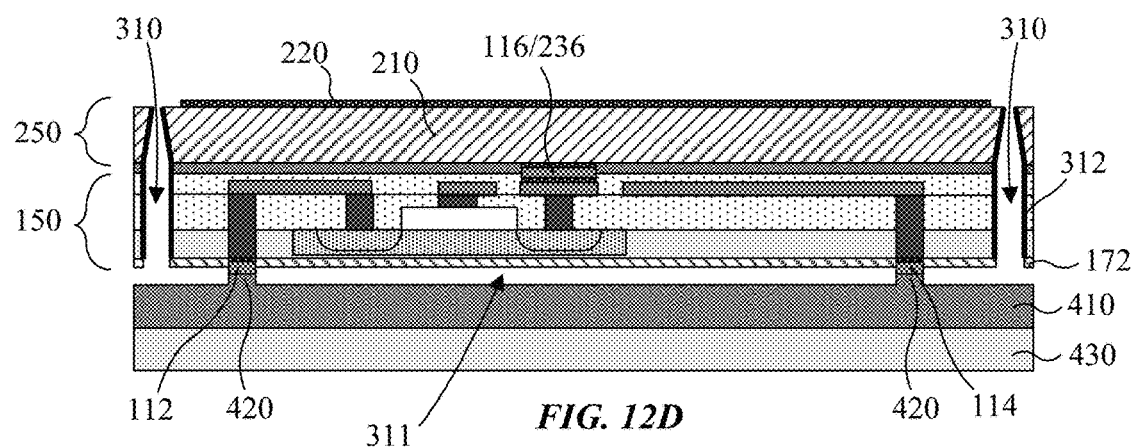

In the embodiment illustrated in FIG. 12D, a single passivation layer 312 spans sidewalls of the vertical micro LED 210 (and micro LED chiplet 250) and sidewalls of the micro driver chiplet 150. The passivation layer 312 may protect the micro LED chiplet 250 and micro driver chiplet 150 during removal of the sacrificial layers 174, 176, as well as during or after integration on the display backplane. As illustrated, the resulting array of hybrid chiplets 300 are surrounded by open trenches 310, with cavities 311 spanning beneath the hybrid chiplets 300, which are supported by an array of support posts 420 of the stabilization layer 410. The hybrid chiplets 300 illustrated in FIG. 12D are poised for pick up and transfer to a display substrate.

Figure 13:
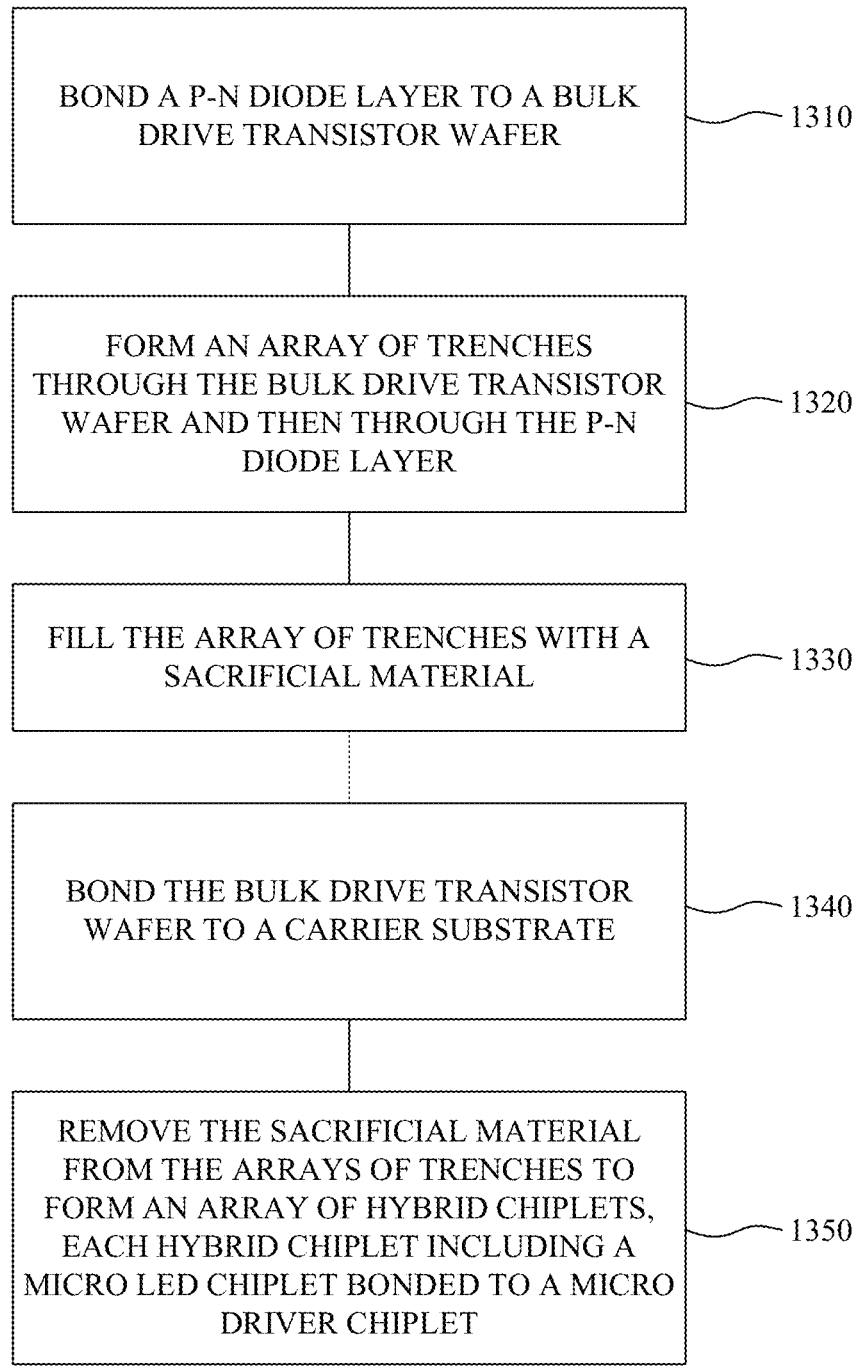
FIG. 13 is a flow chart illustrating method of forming an array of hybrid chiplets with a bottom-side sacrificial trench approach in accordance with an embodiment.

FIG. 13 is a flow chart illustrating method of forming an array of hybrid chiplets 300 with a bottom-side sacrificial trench approach in accordance with an embodiment. FIGS. 14A-14G are schematic cross-sectional side view illustrations of a method of forming an array of hybrid chiplets 300 with a bottom-side sacrificial trench approach in accordance with an embodiment. In interest of clarity, FIGS. 13 and 14A-14G are described concurrently, with reference to the same reference numbers for like features. In addition, it is to be appreciated that the description of the flow chart of FIG. 13 and illustrations in FIGS. 14A-14G are made with regard to the formation of hybrid chiplets 300 including a single drive transistor 110 in each micro driver chiplet, similar to that illustrated in FIG. 4A. However, this description is intended to be exemplary and embodiments are not limited to such.

Figure 14A:
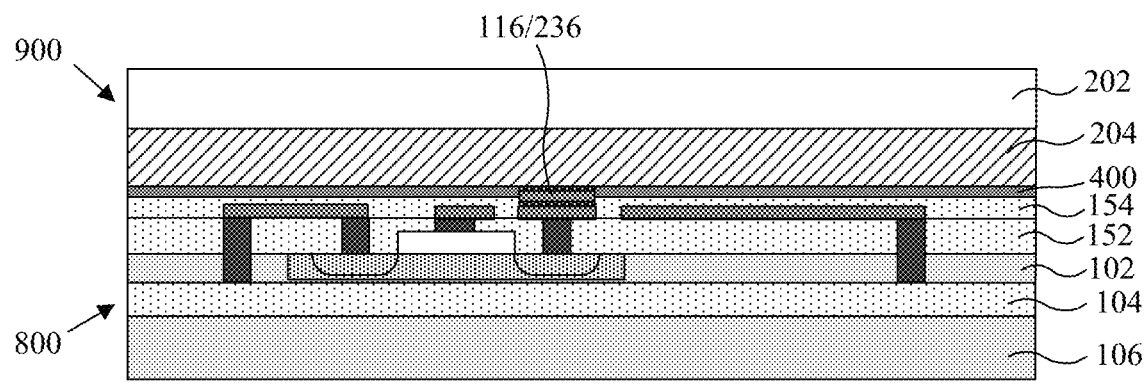
FIGS. 14A-14G are schematic cross-sectional side view illustrations of a method of forming an array of hybrid chiplets with a bottom-side sacrificial trench approach in accordance with an embodiment.
Figure 14B:
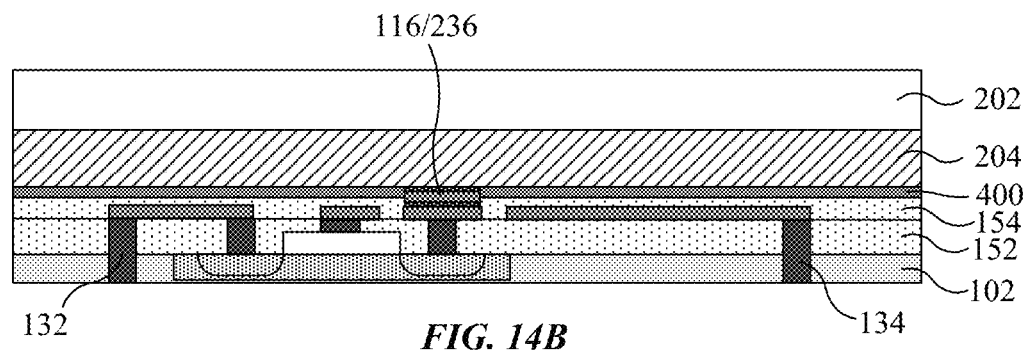

At operation 1310 a p-n diode layer 204 is bonded to a bulk drive transistor wafer 800. Bonding is performed similarly as described with regard to FIG. 12A in which bonding includes punching the bottom LED contacts 236 through the polymer bonding material 400 to contact corresponding anode contacts 116, and bonding the bottom LED contacts 236 to the corresponding anode contacts 116 with metal-metal bonds. As illustrated in FIG. 14B, following bonding, a thickness of the bulk drive transistor wafer 800 is then reduced from the back side. In an embodiment where single crystalline substrate 100 is an SOI substrate, the handle wafer 106 can be removed by back grinding to the buried oxide layer 104, followed by removal of the buried oxide layer 104 with a wet buffered oxide etch. In an embodiment, the resultant structure illustrated in FIG. 14B includes exposed conductive plugs 132, 134.

Figure 14C:
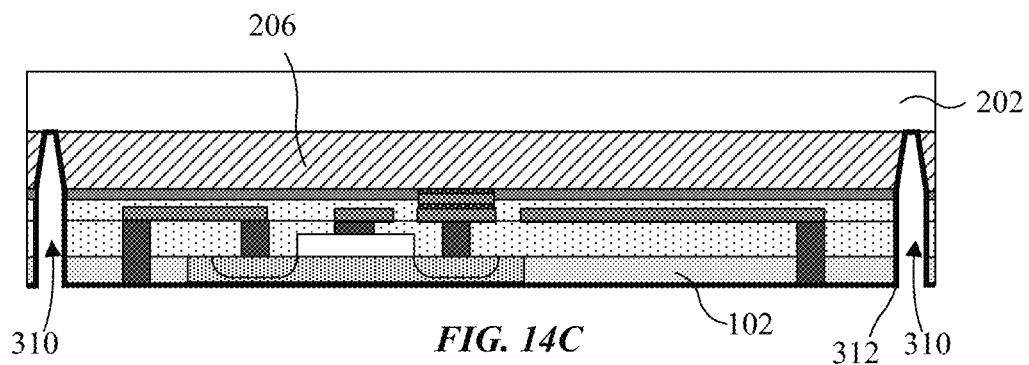

At operation 1320 an array of trenches 310 is formed through the bulk drive transistor wafer 800 and then through the p-n diode layer 204. As illustrated in FIG. 14C, the trenches may be formed through the device layer 102, first interlayer dielectric (ILD-1) 152 and second interlayer dielectric (ILD-2) 154 of the bulk drive transistor wafer 800. The formation of trenches 310 also extends through the polymer bonding material 400, and defines the array of LED mesas 206. Following the formation of trenches 310, a passivation layer 312 may be formed within the trenches 310, and optionally over the bottom surface of the device layer 102. For example, the passivation layer 162 may be AlO$_x$, deposited using a suitable technique such as atomic layer deposition (ALD).

Figure 14D:
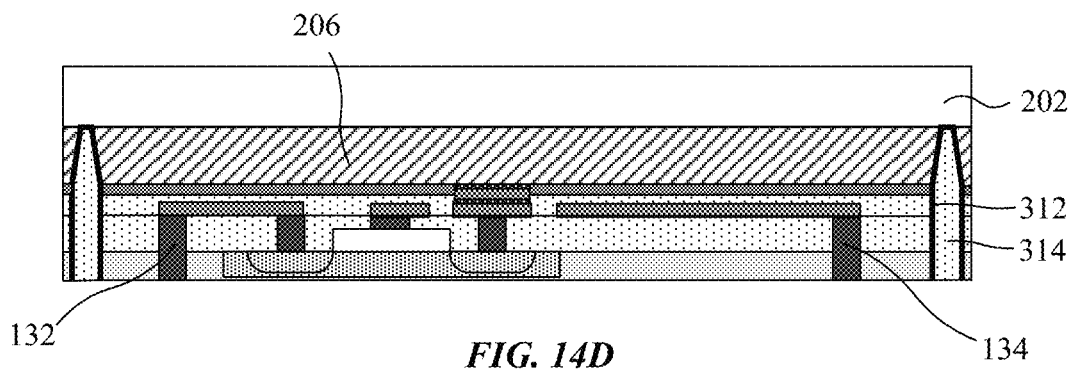

At operation 1330 the array of trenches 310 are filled with a sacrificial material 314 as illustrated in FIG. 14D. In an embodiment, the sacrificial material 164 is formed of an oxide (e.g. SiO$_x$) or nitride (e.g. SiN$_x$) though other materials may be used that can be selectively removed with respect to the other layers. In an embodiment, sacrificial material 164 is formed using a technique such as chemical vapor deposition (CVD) that is suitable to fill the aspect ratios of trenches 160. Following deposition of the sacrificial material 164, the sacrificial material 164 may be etched back, or ground using a technique such as chemical mechanical polishing (CMP). In an embodiment, etch back or grinding may remove passivation layer 312 from the bottom surface of the device layer 102 as illustrated in FIG. 14D.

Figure 14E:
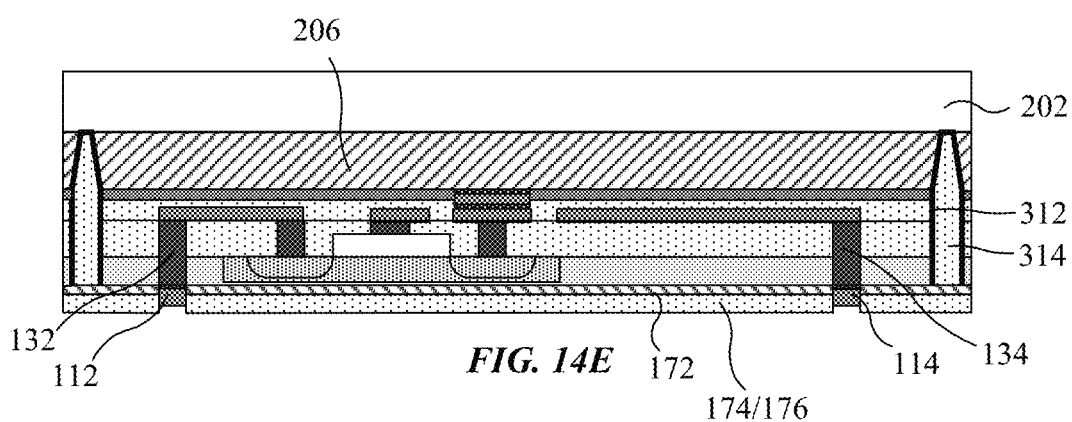
Figure 14F:
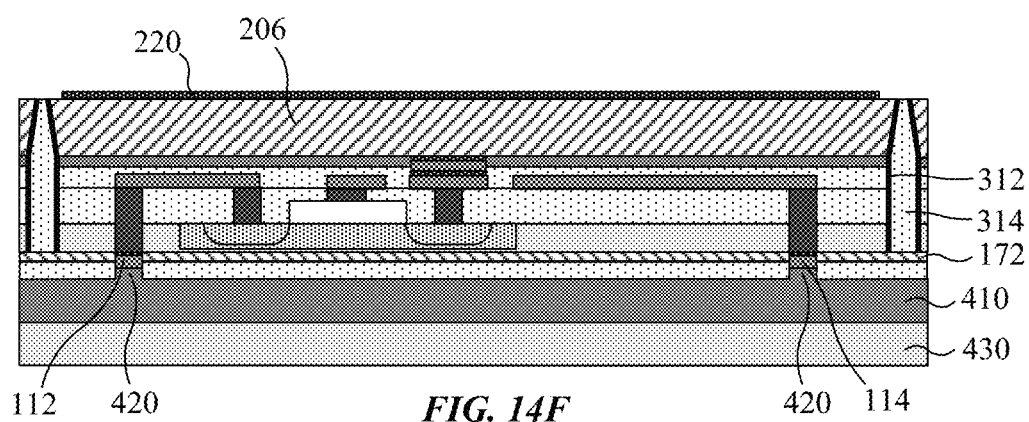

Referring now to FIG. 14E, bottom chiplet contacts (e.g. 112, 114) and sacrificial layers 174, 176 are formed similarly as described with regard to FIGS. 10E-10F. Referring to FIG. 14F, at operation 1340 the bulk drive transistor wafer 800 is bonded to a carrier substrate 430 similarly as described with regard to FIG. 10G. The support substrate 202 may then be removed from the p-n diode layer 204 using suitable techniques such as laser lift-off, grinding, and/or etching. During this process, the passivation layer 312 may be removed from the top of the filled to expose the sacrificial material 314. An array of top LED contacts 220 may be formed on the exposed array of LED mesas 206.

At operation 1350 the sacrificial material 314 is removed from the arrays of trenches 310 to form an array of hybrid chiplets 300, each hybrid chiplet 300 including a micro LED chiplet 250 bonded to a micro driver chiplet 150. In an embodiment, removal of the sacrificial material may include a vapor HF release operation. A wet etch operation may then be performed to etch through the exposed barrier layer 172 (e.g. SiN$_x$), followed by a second vapor HF release to remove the sacrificial layers 174, 176 from underneath the array of hybrid chiplets 300, resulting in the structure illustrated in FIG. 14G.

Figure 14G:
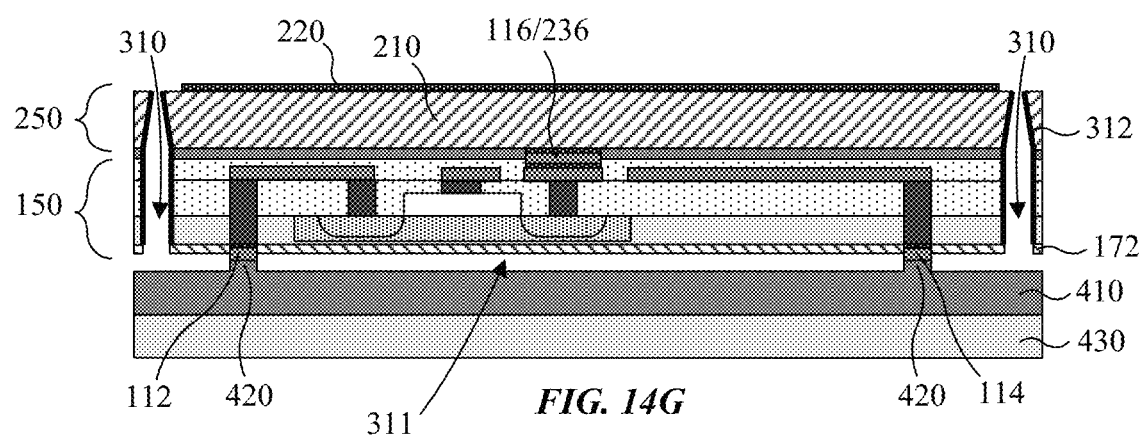

In the embodiment illustrated in FIG. 14G, a single passivation layer 312 spans sidewalls of the vertical micro LED 210 (and vertical micro LED chiplet 250) and sidewalls of the micro driver chiplet 150. The passivation layer 312 may protect the micro LED chiplet 250 and micro driver chiplet 150 during removal of the sacrificial material/layers 314, 174, 176, as well as during or after integration on the display backplane. As illustrated, the resulting array of hybrid chiplets 300 are surrounded by open trenches 310, with cavities 311 spanning beneath the hybrid chiplets 300, which are supported by an array of support posts 420 of the stabilization layer 410. The hybrid chiplets 300 illustrated in FIG. 14G are poised for pick up and transfer to a display substrate.

Figure 15:
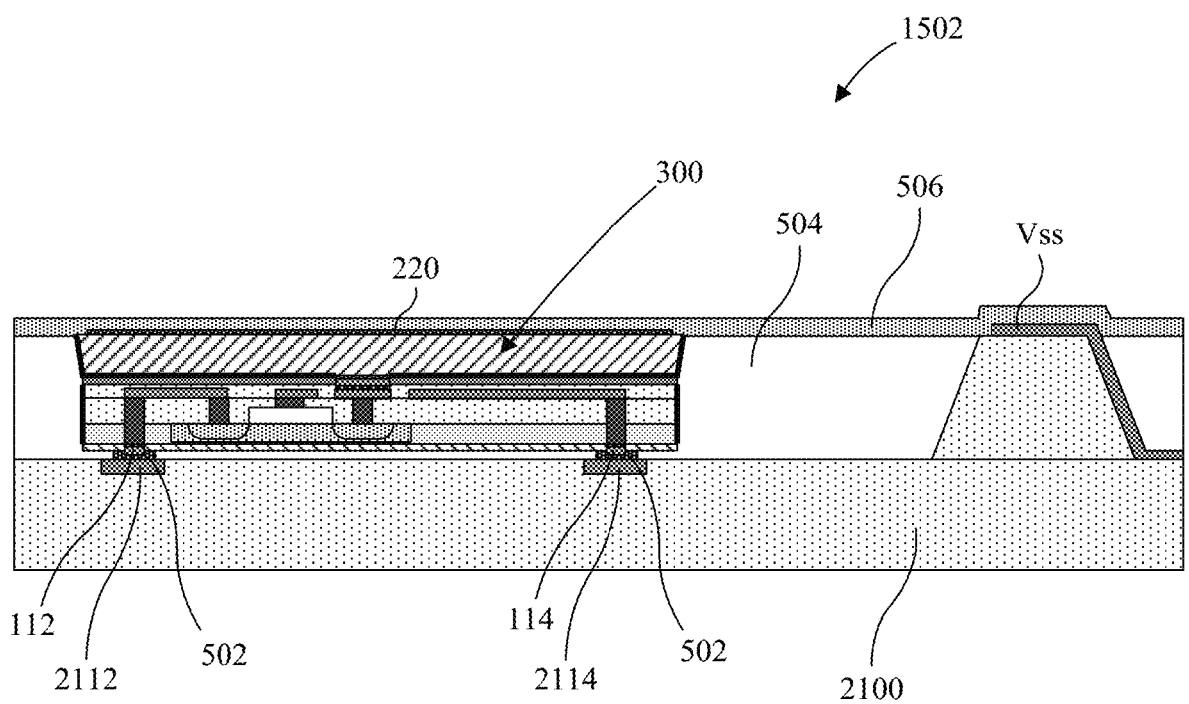
FIG. 15 is a schematic cross-sectional side view illustration of a display including a hybrid chiplet integrated onto a display backplane in accordance with an embodiment.

FIG. 15 is a schematic cross-sectional side view illustration of an exemplary display 1502 including a hybrid chiplet 300 integrated onto a display backplane 2100 in accordance with an embodiment. The hybrid chiplet 300 illustrated in FIG. 15 is intended to be exemplary of all chiplets described in accordance with embodiments, and the particular configuration illustrated in FIG. 15 is not limited to a specific hybrid chiplet 300. The particular subpixel section illustrated in FIG. 15 includes a plurality of contacts pads (e.g. power input pad 2112, selection input pad 2114). A hybrid chiplet 300 including a plurality of bottom chiplet contacts (e.g. power contact 112, gate contact 114) is bonded to the corresponding contact pads (e.g. 2112, 2114). In the embodiment illustrated the bottom chiplet contacts are bonded to the corresponding contact pads with a bonding material 502. In an embodiment, bonding material 502 is a solder material, such as indium, tin, zinc, etc. In an embodiment, the outermost gold layers of the bottom chiplet contacts form an alloy (e.g. Au—In) with the bonding material 502, such as a eutectic alloy or intermetallic compound.

A sidewall passivation layer 504 may then be formed around the hybrid chiplets 300. The sidewall passivation layer 504 may secure the hybrid chiplets 300 to the display backplane 2100 and also provide a step function for application of the top conductive contact layer 506. In an embodiment, sidewall passivation layer 504 is formed by screen printing, slit coating, slot coating, ink jet printing, etc. around the hybrid chiplets 300. For example, a single slot coating layer can be applied across the display backplane 2100 and around all of the hybrid chiplets 300. In an embodiment, the sidewall passivation layer 504 is formed of a thermoset material such as acrylic, epoxy, or BCB. The top LED contacts 220 and the Vss lines may be exposed after application of the sidewall passivation layer 504. In an embodiment, a sputter etch is performed after application of the sidewall passivation layer 504 to ensure the top LED contacts 220 and the Vss lines are exposed. One or more top conductive contact layers 506 may then be applied over the array of hybrid chiplets 300 to electrically connect the hybrid chiplets to the one or more Vss lines. Exemplary materials for the top conductive contact layer 506 include, but are not limited to, transparent conductive oxides (e.g. ITO) and transparent conductive polymers. In an embodiment including a hybrid chiplet 300 similar to that described with regard to FIG. 1D electrical connection to the Vss line can be made with a bottom cathode contact 221.

Figure 16:
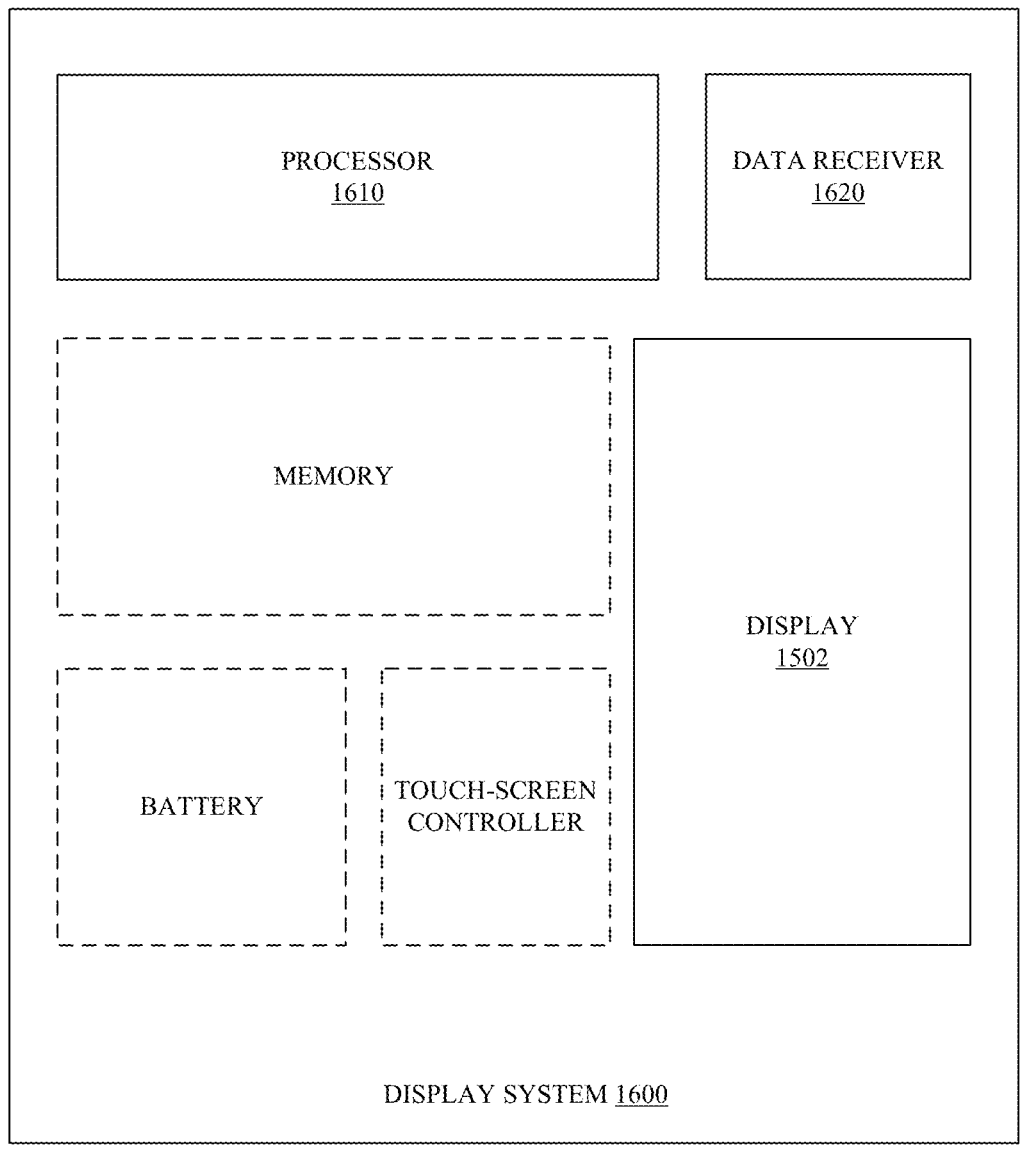
FIG. 16 is a schematic illustration of a display system in accordance with an embodiment.

FIG. 16 illustrates a display system 1600 in accordance with an embodiment. The display system houses a processor 1610, data receiver 1620, a one or more displays 1502 which may include one or more display driver ICs such as scan driver ICs and data driver ICs. The data receiver 1620 may be configured to receive data wirelessly or wired. Wireless may be implemented in any of a number of wireless standards or protocols.

Depending on its applications, the display system 1600 may include other components. These other components include, but are not limited to, memory, a touch-screen controller, and a battery. In various implementations, the display system 1600 may be a television, tablet, phone, laptop, computer monitor, kiosk, digital camera, handheld game console, media display, ebook display, large area signage display, or a wearable device such as a watch.

In utilizing the various aspects of the embodiments, it would become apparent to one skilled in the art that combinations or variations of the above embodiments are possible for the formation and integration of hybrid chiplets. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A hybrid chiplet comprising:
   a carrier substrate; and
   an array of discrete hybrid chiplets supported on the carrier substrate, wherein each hybrid chiplet comprises:
   a micro driver chiplet including:
      a drive transistor;
      a top side including an anode contact electrically connected to a first source/drain terminal of the drive transistor; and
      a bottom side including a plurality of bottom chiplet contacts;
   a micro LED chiplet bonded to the anode contact of the micro driver chiplet; and
   hybrid chiplet sidewalls including sidewalls of the micro driver chiplet and sidewalls of the micro LED chiplet.

2. The hybrid chiplet of claim 1, wherein for each hybrid chiplet the drive transistor is formed in a single crystalline device layer.

3. The hybrid chiplet of claim 1, wherein for each hybrid chiplet the plurality of bottom chiplet contacts comprises:
   a gate contact that is electrically connected to a gate terminal of the drive transistor; and
   a power contact that is electrically connected to a second source/drain terminal of the drive transistor.

4. The hybrid chiplet of claim 3, further comprising for each hybrid chiplet a second drive transistor connected in parallel with the drive transistor between the power contact and the anode contact.

5. The hybrid chiplet of claim 3, wherein for each hybrid chiplet the micro LED chiplet comprises:
   a bottom LED contact that is bonded to the anode contact of the micro driver chiplet.

6. The hybrid chiplet of claim 5, further comprising for each hybrid chiplet a polymer bonding material that adheres the micro LED chiplet to the micro driver chiplet.

7. The hybrid chiplet of claim 5, further comprising for each hybrid chiplet a passivation layer spanning the sidewalls of the micro LED chiplet.

8. The hybrid chiplet of claim 7, further comprising for each hybrid chiplet a second passivation layer spanning the sidewalls of the micro driver chiplet.

9. The hybrid chiplet of claim 7, wherein for each hybrid chiplet the passivation layer further spans along the sidewalls of the micro driver chiplet.

10. The hybrid chiplet of claim 3, wherein for each hybrid chiplet the micro driver chiplet further comprises an emission control transistor in series with the drive transistor and electrically connected between the drive transistor and the power contact.

11. The hybrid chiplet of claim 10, wherein for each hybrid chiplet the bottom side of the micro driver chiplet further comprises an emission control contact that is electrically connected to a gate terminal of the emission control transistor.

12. The hybrid chiplet of claim 11, wherein for each hybrid chiplet the bottom side of the micro driver chiplet further comprises a source contact that is electrically connected to the first source/drain terminal of the drive transistor and is electrically connected between the drive transistor and the anode contact.

13. The hybrid chiplet of claim 3, wherein for each hybrid chiplet the micro driver chiplet further comprises a select transistor.

14. The hybrid chiplet of claim 13, wherein for each hybrid chiplet the bottom side of the micro driver chiplet further comprises a scan contact electrically connected with a gate terminal of the select transistor and a data contact electrically connected with a first source/drain terminal of the select transistor.

15. The hybrid chiplet donor substrate of claim 1, wherein each hybrid chiplet has a maximum lateral dimension of 1 to 300 μm.

16. A display comprising:
a backplane including an array of subpixel circuitries, each subpixel circuitry including a plurality of contact pads;
an array of discrete hybrid chiplets bonded to the array of subpixel circuitries, each hybrid chiplet bonded to the plurality of contacts pads of a corresponding subpixel circuitry, each hybrid chiplet comprising:
a micro driver chiplet including:
a drive transistor;
a top side including an anode contact electrically connected to a first source/drain terminal of the drive transistor; and
a bottom side including a corresponding plurality of bottom chiplet contacts bonded to the plurality of contact pads;
a micro LED chiplet bonded to the anode contact of the micro driver chiplet; and
hybrid chiplet sidewalls including sidewalls of the micro driver chiplet and sidewalls of the micro LED chiplet.

17. The display of claim 16, wherein for each hybrid chiplet and corresponding subpixel circuitry:
the plurality of contact pads comprises a selection input pad and a power input pad;
the plurality of bottom chiplet contacts comprises:
a gate contact that is electrically connected to a gate terminal of the drive transistor; and
a power contact that is electrically connected to a second source/drain terminal of the drive transistor; and
the gate contact is bonded to the selection input pad and the power contact is bonded to the power input pad.

18. The display of claim 17, wherein each micro driver chiplet further comprises a second drive transistor connected in parallel with the drive transistor between the power contact and the anode contact.

19. The display of claim 17, wherein for each hybrid chiplet and corresponding subpixel circuitry:
the plurality of contact pads further comprises an emission control input pad;
the micro driver chiplet further comprises:
an emission control transistor in series with the drive transistor and electrically connected between the drive transistor and the power contact; and
emission control contact that is electrically connected to a gate terminal of the emission control transistor; and
the emission control contact is bonded to the emission control input pad.

20. The display of claim 17, wherein for each hybrid chiplet and corresponding subpixel circuitry:
the plurality of contact pads further comprises a scan input pad and a data input pad;
the micro driver chiplet further comprises a select transistor, a scan contact electrically connected with a gate terminal of the select transistor, and a data contact electrically connected with a first source/drain terminal of the select transistor;
wherein the scan contact is bonded to the scan input pad, and the data contact is bonded to the data input pad.

21. The display of claim 16, wherein each hybrid chiplet has a maximum lateral dimension of 1 to 300 μm.

22. The display of claim 21, wherein for each hybrid chiplet the micro LED chiplet comprises:
a bottom LED contact that is bonded to the anode contact of the micro driver chiplet.

23. The display of claim 22, further comprising for each hybrid chiplet a polymer bonding material that adheres the micro LED chiplet to the micro driver chiplet.

* * * * *